United States Patent
Roberts et al.

(10) Patent No.: US 10,746,475 B2
(45) Date of Patent: Aug. 18, 2020

(54) MULTI-PHASE THERMAL CONTROL APPARATUS, EVAPORATORS AND METHODS OF MANUFACTURE THEREOF

(71) Applicant: California Institute of Technology, Pasadena, CA (US)

(72) Inventors: Scott N. Roberts, Pasadena, CA (US); Arthur J. Mastropietro, Pasadena, CA (US); Benjamin I. Furst, Pasadena, CA (US); Eric T. Sunada, Pasadena, CA (US); Jordan Mizerak, Pasadena, CA (US); Hiroki Nagai, Pasadena, CA (US); Stefano Cappucci, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 15/666,217

(22) Filed: Aug. 1, 2017

(65) Prior Publication Data
US 2018/0031330 A1    Feb. 1, 2018

Related U.S. Application Data

(60) Provisional application No. 62/369,586, filed on Aug. 1, 2016, provisional application No. 62/507,695, filed on May 17, 2017.

(51) Int. Cl.
*F28D 15/02* (2006.01)
*F28D 15/04* (2006.01)
(Continued)

(52) U.S. Cl.
CPC ....... *F28D 15/0266* (2013.01); *F28D 15/025* (2013.01); *F28D 15/0283* (2013.01);
(Continued)

(58) Field of Classification Search
CPC .. F28D 15/046; F28D 15/043; F28D 15/0266; F28D 15/025; F28D 15/0283;
(Continued)

(56) References Cited

U.S. PATENT DOCUMENTS

| 4,602,679 A * | 7/1986 | Edelstein | F28D 15/043 165/104.26 |
| RE35,721 E * | 2/1998 | Daikoku | H01L 23/4338 165/185 |

(Continued)

OTHER PUBLICATIONS

"Pumped Two Phase Cooling", Advanced Cooling Technologies, Retrieved from https://www.1-act.com/innovations/pumped-two-phase-cooling/, 2017, 9 pgs.
(Continued)

*Primary Examiner* — Tho V Duong
(74) *Attorney, Agent, or Firm* — KPPB LLP

(57) ABSTRACT

Multi-phase thermal control systems, evaporators, variable porous wick elements, heat transfer structures, and methods for their production are provided. Two-phase evaporators for use in such multi-phase thermal control systems are also provided. Two-phase evaporators incorporate a vapor plate body having there three major layers: a vapor channel network, a wick, and a liquid channel. The vapor channel network comprises a plurality of extrusions (e.g., vapor pillars) and associated channels (e.g., vapor channels) configured to allow a vapor to flow therethrough. The wick comprises a porous body configured to be disposed between the vapor channel network of and the liquid flow reservoir.

20 Claims, 27 Drawing Sheets

(51) Int. Cl.
  *H01L 23/427* (2006.01)
  *H01L 23/34* (2006.01)
(52) U.S. Cl.
  CPC .......... *F28D 15/046* (2013.01); *H01L 23/427* (2013.01); *H01L 23/345* (2013.01)
(58) Field of Classification Search
  CPC .... H05K 7/20309; H01L 23/427; B33Y 10/00
  See application file for complete search history.

(56) References Cited

U.S. PATENT DOCUMENTS

| | | | | |
|---|---|---|---|---|
| 5,725,049 | A * | 3/1998 | Swanson | F28D 15/043 |
| | | | | 122/366 |
| 6,330,907 | B1 * | 12/2001 | Ogushi | F28D 15/043 |
| | | | | 165/104.26 |
| 6,382,309 | B1 * | 5/2002 | Kroliczek | F28D 15/0233 |
| | | | | 165/104.26 |
| 9,179,575 | B1 * | 11/2015 | Yao | H01L 23/427 |
| 2012/0137718 | A1 * | 6/2012 | Uchida | H05K 7/20336 |
| | | | | 62/259.2 |
| 2013/0223010 | A1 * | 8/2013 | Shioga | H01L 23/13 |
| | | | | 361/700 |
| 2013/0312939 | A1 * | 11/2013 | Uchida | F28D 15/04 |
| | | | | 165/104.26 |
| 2014/0318167 | A1 * | 10/2014 | Uchida | H01L 23/427 |
| | | | | 62/259.2 |

OTHER PUBLICATIONS

"Two-Phase Evaporative Precision Cooling Systems for heat loads from 3 to 300kW", Parker Hannifin Corporation, 2011, 8 pgs.
"The next generation large additive machine", GE Additive, Nov. 15, 2017, Retrieved from the Internet https://www.ge.com/additive/additive-manufacturing/machines/project-atlas, 7 pgs.
Ambrose et al., "A Pumped Heat Pipe Cold Plate for High-Flux Applications", Experimental Thermal and Fluid Science, 1995, Received Aug. 30, 1993, vol. 10, pp. 156-162.
Ameli et al., "A novel method for manufacturing sintered aluminium heat pipes (SAHP)", Applied Thermal Engineering, Jan. 5, 2013, vol. 52, pp. 498-504.
Ameli, "Additive Layer Manufactured Sinter-Style Aluminium/Ammonia Heat Pipes", Sep. 2013 Thesis, Faculty of Engineering and Environment, Research undertaken in the Faculty of Engineering and Environment in collaboration with Thermacore Europe, 182 pages.
Bland et al., "A two-phase thermal management system for large space platforms", AIAA 19th Thermophysics Conference, Jun. 25-28, 1984, AIA-84-1758, 10 pgs.
Choi et al., "Experimental investigation on sintered porous wicks for miniature loop heat pipe applications", Experimental Thermal and Fluid Science, Aug. 11, 2013, vol. 51, pp. 271-278.
Coso et al., "Enhanced Heat Transfer in Biporous Wcks in the Thin Liquid Film Evaporation and Boiling Regimes", Journal of Heat Transfer, Oct. 2012, vol. 134, 11 pgs.
Crepinsek et al., "Effect of operational conditions on cooling performance of pump-assisted and capillary-driven two-phase loop", Journal of Thermophysics and Heat Transfer, Oct.-Dec. 2011, vol. 25, No. 4, pp. 572-580.
Delil et al., "Development of a Mechanically Pumped Two-Phase CO2 Cooling Loop for the AMS-2 Tracker Experiment", National Aerospace Laboratory NLR, SAE Technical Paper, No. 2002-01-2465, Jul. 14-18, 2002, 11 pgs.
Frazier et al., "Metal Additive Manufacturing: A Review", Journal of Materials Engineering and Performance, Jun. 2014, vol. 23, No. 6, pp. 1917-1928, doi: 10.1007/s11665-014-0958-z.
Friedel, "Improved friction pressure drop correlations for horizontal and vertical two phase pipe flow", 3R International, Jul. 1979, vol. 18, No. 7, 7 pgs.

Furst et al., "A Comparison of System Architectures for a Mechanically Pumped Two-Phase Thermal Control System", 47th International Conference on Environmental Systems, Jul. 16-20, 2017, ICES-2017-119, 20 pgs.
Holley et al., "Permeability and effective pore radius measurements for heat pipe and fuel cell applications", Applied Thermal Engineering, 2006, Accepted May 22, 2005, vol. 26, pp. 448-462.
Jiang et al., "Experimental investigation of pump-assisted capillary phase change loop", Applied Thermal Engineering, Jul. 19, 2014, vol. 71, pp. 581-588.
Konishi et al., "Review of flow boiling and critical heat flux in microgravity", International Journal of Heat and Mass Transfer, 2015, Available online Oct. 11, 2014, vol. 80, pp. 469-493.
Krishna et al., "Low stiffness porous Ti structures for load-bearing implants", Acta Biomaterialia, May 25, 2007, vol. 3, pp. 997-1006.
Ku, Operating characteristics of loop heat pipes, 29th International Conference on Environmental System, Jul. 12-15, 1999, 1999-01-2007, 16 pgs.
Ku et al., "The Hybrid Capillary Pumped Loop", SAE Technical Paper, No. 881083, 1988, 11 pgs.
Lemmon et al., "NIST reference fluid thermodynamic and transport properties-REFPROP", NIST standard reference database 23, Version 7.0, Aug. 2002, 162 pgs.
Liu et al., "Experimental Investigation of New Flat-Plate-Type Capillary Pumped Loop", Journal of Thermophysics and Heat Transfer, Jan.-Mar. 2008, vol. 22, No. 1, pp. 98-104.
Lockhart et al., "Proposed correlation of data for isothermal two-phase, two-component flow in pipes", Chemical Engineering Progress, 1949, vol. 45, No. 1, pp. 39-48.
Marchitto et al., "Experiments on two-phase flow distribution inside parallel channels of compact heat exchangers", International Journal of Multiphase Flow, 2008, Received Feb. 14, 2007, vol. 34, pp. 128-144.
Nguyen et al., "Study on heat transfer performance for loop heat pipe with circular flat evaporator", International Journal of Heat and Mass Transfer, 2012, Received Dec. 26, 2010, vol. 55, pp. 1304-1315.
Park et al., "Performance Evaluation of a Pump-Assisted, Capillary Two-Phase Cooling Loop", Journal of Thermal Science and Engineering Applications, Jun. 2009, vol. 1, 022004, 8 pgs., doi: 10.1115/1.4000405.
Reay et al., "Cooling of electronic components", Heat Pipes: Theory, Design and Applications, 6th Edition, 2014, Chapter 8, pp. 207-225.
Reay et al., "Historical development", Heat Pipes: Theory, Design and Applications, 6th Edition, 2014, Chapter 1, pp. 1-13.
Reay et al., "Special types of heat pipe", Heat Pipes: Theory, Design and Applications, 6th Edition, 2014, Chapter 6, pp. 135-173.
Reilly et al., "Utilization of Pore-Size Distributions to Predict Thermophysical Properties and Performance of Biporous Wick Evaporators", ASME Journal of Heat Transfer, Jun. 2014, vol. 136, pp. 061501-1-061501-10.
Richard et al., "Loop Heat Pipe Wick Fabrication via Additive Manufacturing", 47th International Conference on Environmental Systems, Jul. 16-20, 2017, ICES-2017-12, 10 pgs.
Sakamoto et al., "Development of Two-Phase Mechanically Pumped Fluid Loop with Large Isothermal Evaporator using Porous Wick Structure", 47th International Conference on Environmental Systems, ICES-2017-137, Jul. 16-20, 2017, 9 pgs.
Schweickart et al., "Testing of a controller for a hybrid capillary pumped loop thermal control system", Energy Conversion Engineering Conference, Proceedings of the 24th Intersociety, IEEE 1989, 1989, pp. 69-74.
Sunada et al., "A Two-Phase Mechanically Pumped Fluid Loop for Thermal Control of Deep Space Science Missions", 46th International Conference on Environmental Systems, ICES-2016-129, Jul. 10-14, 2016, 20 pgs.
Tsai et al., "Flat plate loop heat pipe with a novel evaporator structure", 21st IEEE Semi-Therm Symposium, 2005, 4 pgs.
Wan et al., "Heat transfer with flow and phase change in an evaporator of miniature flat plate capillary pumped loop", Journal of Thermal Science, Apr. 2007, vol. 16, No. 3, pp. 254-263.

(56) References Cited

OTHER PUBLICATIONS

Zhang et al, "Single-phase liquid cooled microchannel heat sink for electronic packages", Applied Thermal Engineering, Jul. 2005, vol. 25, pp. 1472-1487.

Drolen et al., "Lithium Ion Battery Thermal Propagation Modeling: Considerations and Lessons Learned", 2017, Retrieved from the Internet https://nescacademy.nasa.gov/video/f9c8eb57f8114f47b279877b703214cc1d, 14 pgs.

Gou et al., "Feasibility study on a novel 3D vapor chamber used for Li-ion battery thermal management system of electric vehicle", Applied Thermal Engineering, Feb. 9, 2019, 15 pgs., doi: https://doi.org/10.1016/j.applthermaleng.2019.02.034.

Kim et al., "Review on Battery Thermal Management System for Electric Vehicles", Applied Thermal Engineering, Dec. 3, 2018, 84 pgs., doi: 10.1016/j.applthermaleng.2018.12.020.

Parhizi et al., "Analytical Modeling and Optimization of Phase Change Thermal Management of a Li-ion Battery Pack", Applied Thermal Engineering, Nov. 5, 2018, 41 pgs. doi: 10.1016/j.applthermaleng.2018.11.017.

Rickman et al., "Considerations for the Thermal Modeling of Lithium-Ion Cells for Battery Analysis", 46th International Conference on Environmental Systems, Jul. 10-14, 2016, Vienna, Austria, ICES-2016-009, 17 pgs.

Ruiz et al., "JRC exploratory research: Safer Li-ion batteries by preventing thermal propagation", JRC Technical Reports, Workshop report: summary & outcomes, JRC Petten, Netherlands, Mar. 8-9, 2018, 53 pgs.

Singh et al., "Battery Cooling Architectures for Electric Vehicles Using Heat Pipes", Joint 19th IHPC and 13th IHPS, Pisa, Italy, Jun. 10-14, 2018, 10 pgs.

Wilke et al., "Preventing thermal runaway propagation in lithium ion battery packs using a phase change composite material: An experimental study", Journal of Power Sources, 2017, First Published Nov. 22, 2016, vol. 340, pp. 51-59, doi: 10.1016/j.jpowsour.2016.11.018.

Wu et al., "Experimental investigation on the thermal performance of heat pipe-assisted phase change material based battery thermal management system", Energy Conversion and Management, Feb. 21, 2017, vol. 138, pp. 486-492, doi: 10.1016/j.enconman.2017.02.022.

Yuan et al., "Inhibition effect of different interstitial materials on thermal runaway propagation in the cylindrical lithium-ion battery module", Applied Thermal Engineering, Feb. 25, 2019, vol. 153, pp. 39-502, doi: https://doi.org/10.1016/j.applthermaleng.2019.02.127.

* cited by examiner

MULTI-PHASE THERMAL CONTROL APPARATUS, EVAPORATORS AND METHODS OF MANUFACTURE THEREOF

CROSS-REFERENCE TO RELATED APPLICATIONS

This application claims priority to U.S. Patent Application No. 62/369,586, filed Aug. 1, 2016, and U.S. Patent Application No. 62/507,695, filed May 17, 2017, the disclosures of which is incorporated herein by reference in their entirety.

STATEMENT REGARDING FEDERALLY SPONSORED RESEARCH

The invention described herein was made in the performance of work under a NASA contract NNN12AA01C, and is subject to the provisions of Public Law 96-517 (35 USC 202) in which the Contractor has elected to retain title.

FIELD OF THE INVENTION

The invention is generally directed to multi-phase thermal control systems, components thereof, and methods of their manufacture.

BACKGROUND

Multi-phase heat transfer can provide order of magnitude improvements over single-phase systems in terms of system resource usage. In addition, it can be enabling for future instruments by lowering the thermal-related noise floor through its high degree of temperature stability. Multi-phase heat transfer relies on the proper management of liquid, vapor, and sometimes solid phases of the heat transfer fluid. The current state-of-the-art utilizes a porous media to provide this phase management as well as capillary-based pumping for autonomous operation. Conventional systems use sintered metals to provide such media, albeit with a homogenous porosity. These parts are then integrated into heat acquisition and heat rejection devices.

SUMMARY OF THE INVENTION

In many embodiments, the invention is directed to multi-phase thermal control systems, and methods of their manufacture.

Some embodiments are directed to a multi-phase evaporator including:
- an evaporator body having at least one outer heating surface and defining an internal volume;
- a vapor channel network comprising a plurality of elongated heat transfer elements separated by a plurality of channels, wherein the elongated heat transfer elements have first ends interconnected with an inner wall of the internal volume opposite at least one outer heating surface such that the elongated heat transfer elements and the outer heating surface are in thermal contact, and having second ends distal from inner wall;
- a wick element comprising a liquid porous body disposed in contact with the second ends of the plurality of elongated heat transfer elements;
- a fluid reservoir disposed within the internal volume such that the wick element is interposed between the fluid reservoir and the vapor channel network;
- at least one fluid inlet disposed in a wall of the evaporator body such that fluid flows into the fluid reservoir; and
- at least one outlet disposed in a wall of the evaporator body distal from the at least one fluid inlet, the at least one outlet configured to transport both heated vapor and heated liquid from the evaporator body.

In other embodiments the multi-phase evaporator includes:
- at least two outlets, wherein at least a first outlet is configured to transport heated liquid from the fluid reservoir, and wherein at least a second outlet is configured to transport heated vapor from the vapor channel network; and
- wherein the wick element is disposed within the evaporator body and configured as a phase separator between the vapor channel network and the fluid reservoir.

In still other embodiments the wick element spans the entire opening between the fluid reservoir and the vapor channel network.

In yet other embodiments the multi-phase evaporator includes at least one mixed-phase outlet configured to transport both heated vapor and heated liquid from the evaporator, and wherein the wick element only partially spans the opening between the fluid reservoir and the vapor channel network such that a mixing region is formed adjacent the at least one mixed-phase outlet where heated vapor from the vapor channel network and heated liquid from the fluid reservoir interact prior to flowing into the at least one mixed-phase outlet.

In still yet other embodiments the multi-phase evaporator includes an evaporator cap configured to seal the internal volume adjacent the fluid reservoir.

In still yet other embodiments the evaporator cap further comprises a plurality of depressions formed into the inner surface thereof, the plurality of depressions being configured to engage a plurality of resilient members configured to engage and apply a preload force onto the wick element such that thermal contact is maintained between the wick element and the second surfaces of the plurality of elongated heat transfer elements.

In still yet other embodiments the wick element is formed of a porous material having variable porosity.

In still yet other embodiments the porosity of the wick element varies continuously through the cross-section of the wick element.

In still yet other embodiments the wick element is integrally formed into the body of the evaporator.

In still yet other embodiments the wick element serves as a structural member of the body of the evaporator.

In still yet other embodiments the at least one heating surface is configured to conform with the body of an external heat generating element.

In still yet other embodiments the multi-phase evaporator includes a plurality of resilient members configured to engage and apply a preload force onto the wick element such that thermal contact is maintained between the wick element and the second surfaces of the plurality of elongated heat transfer elements.

In still yet other embodiments the plurality of elongated heat transfer elements comprise pillars having a uniform geometric cross-section, the pillars being one of either solid or porous.

In still yet other embodiments the ratio of the width of a length determined by the width of an elongated heat transfer element and adjacent vapor channel to the width of the elongated heat transfer element is from 0.5 to 0.8.

In still yet other embodiments the width of the elongated heat transfer element is from 0.25 to 0.4 inches.

In still yet other embodiments the walls of the evaporator are formed from low thermally conducting materials.

Still other embodiments are directed to a thermal control system including:
- a fluid handling system comprising a plurality of interconnected fluid conduits;
- a pump in fluid communication with the fluid handling system;
- an evaporator in fluid communication with the fluid handling system and configured to pick up a heat load comprising:
  - an evaporator body having at least one outer heating surface an defining an internal volume,
    - a vapor channel network comprising a plurality of elongated heat transfer elements separated by a plurality of channels, wherein the elongated heat transfer elements have first ends interconnected with an inner wall of the internal volume opposite the at least one outer heating surface such that the elongated heat transfer elements and the outer heating surface are in thermal contact, and having second ends distal from inner wall,
    - a wick element comprising a liquid porous body disposed in contact with the second ends of the plurality of elongated heat transfer elements,
    - a fluid reservoir disposed within the internal volume such that the wick element is interposed between the fluid reservoir and the vapor channel network,
    - at least one fluid inlet disposed in a wall of the evaporator body such that fluid flows into the fluid reservoir, and
    - at least one outlet disposed in a wall of the evaporator body distal from the at least one fluid inlet, the at least one outlet configured to transport both heated vapor and heated liquid from the evaporator body;
- a condenser in fluid communication with the fluid handling system downstream of the evaporator and configured to reject the heat load; and
- an accumulator in fluid communication with the fluid handling system disposed at an inlet of the pump and configured to regulate the system pressure.

In other embodiments the thermal control system includes:
- at least two outlets, wherein at least a first outlet is configured to transport heated liquid from the fluid reservoir, and wherein at least a second outlet is configured to transport heated vapor from the vapor channel network; and
- wherein the wick element is disposed within the evaporator body and configured as a phase separator between the vapor channel network and the fluid reservoir.

In still other embodiments the thermal control system includes at least one mixed-phase outlet configured to transport both heated vapor and heated liquid from the evaporator, and wherein the wick element only partially spans the opening between the fluid reservoir and the vapor channel network such that a mixing region is formed adjacent the at least one mixed-phase outlet where heated vapor from the vapor channel network and heated liquid from the fluid reservoir interact prior to flowing into the at least one mixed-phase outlet.

In yet other embodiments the thermal control system of claim 19, further comprising a pre-heater in fluid communication with the fluid handling system upstream of the evaporator.

In still yet other embodiments the wick element is formed of a porous material having variable porosity.

In still yet other embodiments the thermal control system includes a plurality of resilient members configured to engage and apply a preload force onto the wick element such that thermal contact is maintained between the wick element and the second surfaces of the plurality of elongated heat transfer elements.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description and claims will be more fully understood with reference to the following figures and data graphs, which are presented as exemplary embodiments of the invention and should not be construed as a complete recitation of the scope of the invention.

DETAILED DESCRIPTION

Figure 1:
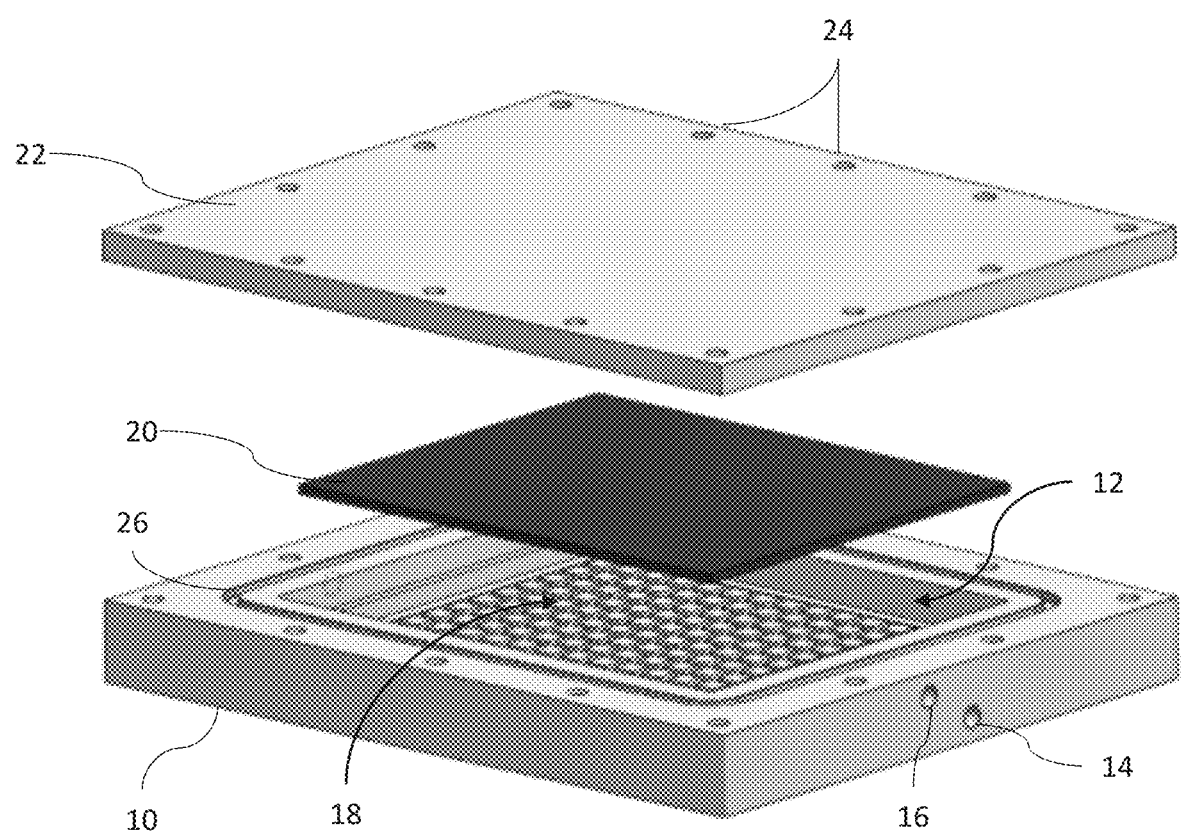
FIG. 1 provides a schematic on a multi-phase evaporator according to embodiments.

Turning now to the drawings and data, multi-phase thermal control systems, variable porous wick heat transfer structures, and methods for their production are provided. Many embodiments are directed to two-phase evaporators for use in such multi-phase thermal control systems. In various embodiments, such two-phase evaporators incorporate a vapor plate body having there three major layers: a vapor channel network, a wick element, and a liquid channel. In many such embodiments the vapor channel network comprises a plurality of extrusions (e.g., vapor pillars) and associated channels (e.g., vapor channels) configured to allow a vapor to flow therethrough. In various embodiments, the wick element comprises a porous body configured to be disposed between the vapor channel network of and the liquid flow reservoir. In many embodiments, the wick element has a variable porosity. In some such embodiments, the wick element may be made using a stochastic additive manufacturing process such that the wick element may take any configuration and/or such that the wick element may be directly integrated into the body of the evaporator as a unitary piece thereof.

Although certain embodiments will be described in the following discussion, it will be understood that the nature of the vapor channel network, the wick element and the liquid reservoir may be modified as necessary to suit required heat flow conditions, such conditions determinable through methods further described herein.

In various embodiments, the multi-phase evaporator in accordance with embodiments is disposed within a larger multi-phase heat transfer system in association with suitable fluid transfer conduits, pumps, filters, condensors etc. as will be readily configurable by those skilled in the art. During operation of embodiments of such heat transfer systems, one or more two-phase evaporators are disposed in such a fluid handling system and the outer face of the vapor network is placed into thermal contact with a surface the temperature of which is to be managed. In many embodiments, the evaporator is configured such that as fluid fills the reservoir, the wick becomes saturated with the fluid, and heat is conduct through the extrusions in the vapor channel network to heat the wick and evaporate the fluid at the surface of the wick adjacent to the vapor channels such that the vapor is released into the vapor channel network. This vapor then spreads and percolates through the network of channels, spreading away from the heated area. Embodiments of such multi-phase heat transfer systems may incorporate mixed-phase and single-phase architectures. The operation of such devices according to embodiments will be described in greater detail below.

Thermal management is becoming more and more critical, particularly as electronics are miniaturized and the need for the heat flux increases. The current state-of-the-art for heat transfer is a mechanically pumped single-phase cooling loop. In this system, the working fluid rejects heat by raising its bulk temperature. (See, e.g., Zhang, H., et al., *Applied Thermal Engineering* 25, 1472-1487 (2005), the disclosure of which is incorporated herein by reference.) While this design provides a robust system, it requires a substantial amount of mass and pumping power, and provides low effectiveness in rejecting heat. Additionally, there are capillary pumped two-phase cooling loops, where a wick structure produces a pressure gradient for a working fluid to flow through the system while vaporizing and condensing to reject heat. (See, e.g., Liu, Z., et al., *Journal of Thermophysics and Heat Transfer* 22, 98-104 (2008), the disclosure of which is incorporated herein by reference.) These systems take advantage of the high heat of vaporization by way of phase change and do not require an external pump, but do not offer much geometric flexibility for heat source location and are sensitive to varying gravitational conditions. (See, e.g., Park, C., Vallury, A. & Zuo, J. *Journal of Thermal Science and Engineering Applications* 1, 022004 (2009), the disclosure of which is incorporated herein by reference.) A new technology that combines the best of these two systems is a mechanically pumped two-phase cooling loop. Using phase change, such systems are able to reduce system mass substantially with more efficient heat transfer, while the mechanical pumping provides the capability to reach distributed heat loads while controlling the temperature to produce an isothermal surface.

In such mechanically pumped two-phase cooling loops, the evaporator component of the mechanically pumped two-phase loop is critical towards operation. This is partly because in poorly designed evaporators vapor bubbles can grow large and block the heated surface from direct liquid contact, thereby substantially increasing thermal resistance. Unless the flow rate is excessively high to operate in inertia-dominated flow conditions, traditional evaporators experience premature dry out and therefore degraded heat transfer. (Konishi, C. & Mudawar, I. *International Journal of Heat and Mass Transfer* 80, 469-493 (2015), the disclosure of which is incorporated herein by reference.)

Embodiments of Multi-Phase Heat Transfer Systems

Many embodiments are directed to a multi-phase evaporator generally comprising a vapor region and a liquid region separated by porous wick. In various embodiments, the multi-phase evaporator comprises three general constructs: a vapor plate having a vapor channel network, a liquid flow reservoir, and a porous wick material disposed therebetween. Such an evaporator architecture forms an isothermal heat acquisition surface since during nominal operation, only vapor (close to the saturation temperature) is present in the vapor channel, and as a result, any subcooled liquid is kept away from the heated surface by the wick.

An exemplary embodiment of the multi-phase evaporator is depicted in FIG. 1. As shown, the multi-phase evaporator generally comprises an evaporator body (10) defining an internal volume (12) and at least vapor (14) and liquid (16) inlets. Within the internal volume is disposed a vapor channel network (18) defined by a plurality of elongated heat transfer features and channels through which the vapor will flow. A porous wick element (20) is disposed in thermal transfer arrangement on top of the heat transfer features of the vapor channel network. An evaporator cap (22) is then disposed atop the evaporator body (10) such that a fluid reservoir is formed between the wick and the evaporator cap. In accordance with embodiments, the evaporator may be a unitary body or a multi-element body. Sealing bolts (24) and an O-ring channel (26) may be provided to form a sealed system in embodiments where a multi-element body is used.

Figure 2A:
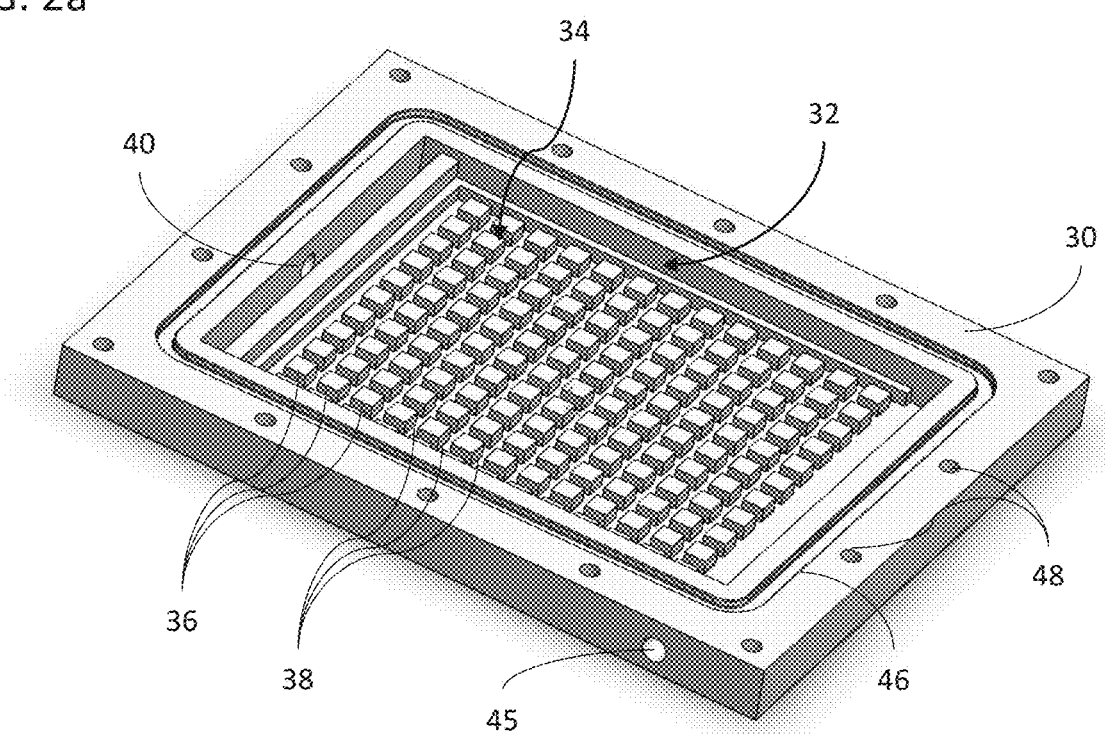
FIG. 2a provides a schematic of an evaporator body of a multi-phase evaporator according to embodiments.
Figure 2B:
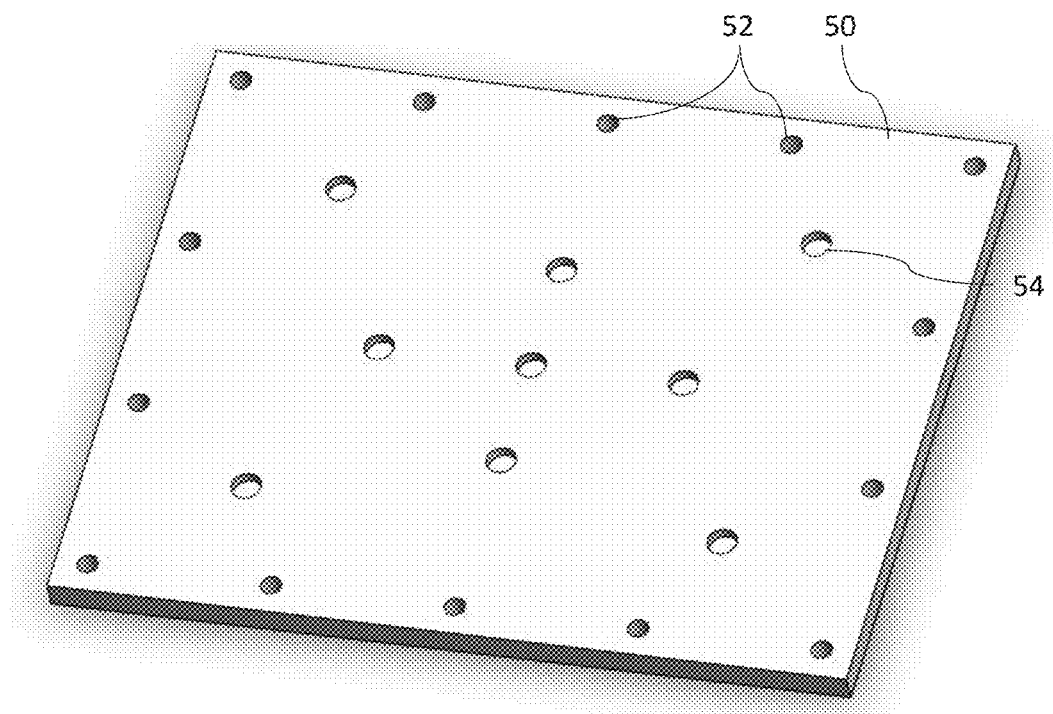
FIG. 2b provides a schematic of an evaporator cap of multi-phase evaporator according to embodiments.

A detailed view of the primary elements of a multi-phase evaporator in accordance with embodiments is provided in FIGS. 2a and 2b. As shown in FIG. 2a, the evaporator body (30) comprises an inner volume (32) having a vapor channel network (34) formed of a plurality of elongated heat transfer features (36) separated by a network of vapor channels (38). Although heat transfer features formed of elongated solid body square pillars are shown in the figures, it will be understood that the heat transfer features may take a number of alternative forms including, for example, different geometric cross-sections (e.g., round, oval, hexagonal, etc.), and may be porous or solid. A fluid inlet (40) is disposed at a height on the evaporator body such that it is above the level on which the wick element (not shown) is positioned (e.g., atop the heat transfer features (36) of the vapor channel network) such that cooling liquid flows into the fluid reservoir (42) and is separated from the vapor channel network by the porous body of the wick element. In the embodiment shown in FIG. 2a, a separate edging (44) is provided to constrain movement of the wick element and ensure a fluid tight seal between the vapor channel network (34) and the fluid reservoir (42), which is defined by the portion of the inner volume (32) of the evaporator body between the wick element and the enclosing cap (not shown). At least one fluid outlet (45) is also provided such that heated fluid and/or vapor may be discharged from the evaporator. As will be described in greater detail below, in accordance with embodiments, the number and positioning of the wick element and the outlet will depend on whether the evaporator is to operate in a single or mixed-phase configuration.

As shown, in multi-element evaporator bodies, (i.e., not unitary constructions) the evaporator body may be provided with a channel (46) for containing an o-ring seal, and cooperating bolt holes (48) to allow the evaporator cap to be secured thereto such that a fluid-tight seal is formed therebetween.

Because the evaporating environment needs to be at saturated conditions with no foreign gases, a secure hermetic seal needs to be made for proper operation. In embodiments, this can be accomplished by using a unitary body, welding the two plates, alternatively welding of inlet and outlet plenums on either side of the evaporator, or the two plates may be designed to be sealed by an O-ring using bolts around the outside to clamp the plates together, as shown in FIGS. 2a and 2b.

An exemplary embodiment of the cap of a sealed system is provided in FIG. 2b. As shown, the evaporator cap (50) can, according to some embodiments, contain cooperative bolt holes (52) and can, in some embodiments, be provided with a plurality of depressions (54) disposed on the inner surface thereof. These depressions can be formed to provide securing points into which springs or other resilient elements may be placed to provide a preload force on the wick element to ensure thermal contact is maintained between the wick element and the thermal transfer features of the vapor channel network.

Although a specific arrangement of features, including channel and heat transfer features, inlets and outlets, wick element position, resilient member, evaporator cap, and resilient elements have been described, it will be understood that the number and arrangement of these elements may take many alternative configurations in accordance with embodiments, as will be described in greater detail below.

Liquid Channel Design

There are two general concerns for the liquid channel: to avoid a large pressure drop and to have a large enough volume of cooling liquid such that the wick element can continuously have a liquid supply for wetting the heated surface. In this case, both of these requirements tend toward embodiments having a larger liquid channel. Accordingly, in many embodiments, as shown in FIGS. 1 and 2, a single, voluminous reservoir through which the liquid flows is provided. As a liquid traveling through such a larger reservoir will travel at a lower velocity, the pressure drop, which can be calculated using techniques, which are described in greater detail in the Exemplary Embodiments, is negligible. Therefore, the main consideration is having a channel, which can continuously provide liquid to saturate the wick element. For example, with a wick of 0.25" that is generally around 35% empty space, a height of liquid equivalent to 2.5 times the amount of liquid in a given column of the wick element may be chosen, which works out to be 0.225". This ensures that even in areas near the discrete heat loads, there will be plenty of liquid available to re-wet the wick element and have liquid coverage on the boiling surface. Details on making these calculations are also provided in greater detail below.

Heated Surface and Vapor Channel Design

Figure 3:
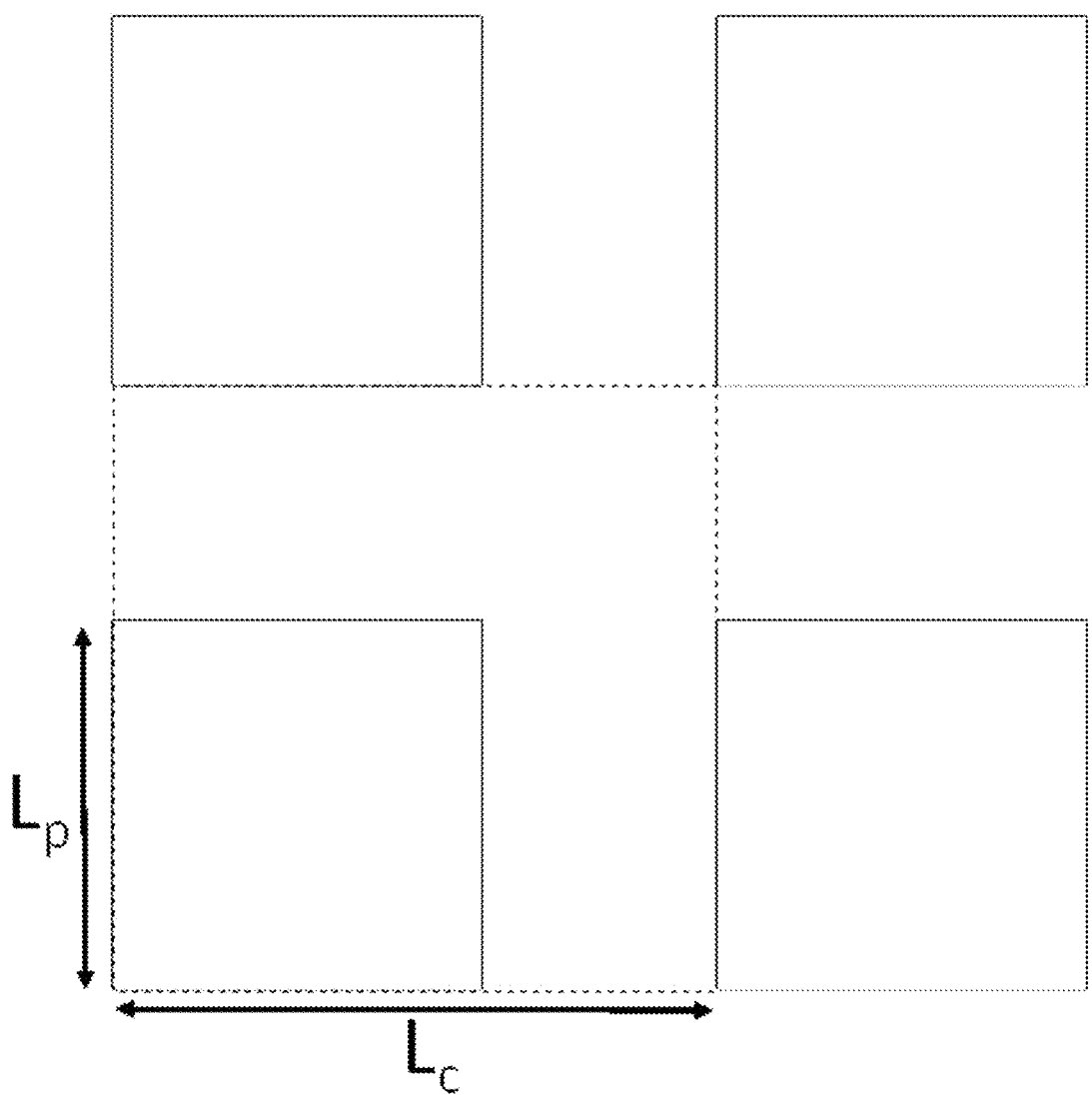
FIG. 3 provides a schematic depiction of a unit cell for vapor network design according to embodiments.

As shown in the figures, the vapor channel network is configured as a two-dimensional network of channels such that vapor is not concentrate in a particular area where a discrete heat source is placed. By allowing the vapor to spread out across the area of the plate, the vapor not only has a larger effective hydraulic diameter through which to flow and thus reduce pressure drop, but it will also be less likely to expand back into the wick and displace liquid from the heated surface. The process of determining the sizing, spacing, and frequency of these channels is not trivial. Following are the three major considerations to optimize the heat transfer from the heat transfer features to the wick element as well as minimize the pressure drop of the higher velocity vapor flow through the channels. To quantify the vapor channel design, consider a unit cell of the vapor network shown in FIG. 3, with important parameters $L_p$ being the dimension of the pillar and $L_c$ being the dimension of the unit cell.

Wick Contact Area with Heated Surface:

The first consideration is the contact area of the wick element with the heated surface of the evaporator body. As the body in accordance with embodiments is made from highly conductive material, such as, for example, aluminum or copper, the heat will spread and provide a nearly uniform local heat flux to the heated surface. Therefore, to maximize the heat transfer to the wick element where the liquid evaporates, in accordance with embodiments, the largest possible percentage of the heated surface is to be in contact with the wick element, or the ratio $L_p/L_c$ is to approach 1. Thus, the heat transfer contact area goes as $(L_p/L_c)^2$, as plotted in FIG. 4. Accordingly, in many embodiments for high heat transfer, a high ratio of Lp=Lc is desired.

Vapor Buildup in Wick:

The next consideration is avoiding vapor buildup in the wick element at the heat transfer element surfaces. While large heat transfer elements ensure that more of the heat source gets delivered to the wick element surface, they also prohibit vapor from escaping into the vapor channels. In the limit where $L_p=L_c$, the liquid would vaporize at the surface of the wick element, have no vapor channel to enter, and simply displace liquid out of the wick element just like in normal film boiling. In the limit where $L_c \rightarrow 0$, vapor forms at the surface of the wick element and has no distance to travel before releasing into the channel and allowing the wick to re-wet. A reasonable representation to quantify this phenomenon is by use of Darcy's Law for flow in porous media, given by EQ. 1.

$$Q = -\frac{KA}{\mu_l}\frac{\Delta P}{\Delta x} \quad \text{(EQ. 1)}$$

Since a smaller pressure drop of vapor in the wick element corresponds to a preferred design, rearranging for ΔP will present a useful form of EQ. 1. A priori, the relevant length scales for flow rate $Q=\varepsilon L_p^2 h/\Delta t$ and cross sectional area of flow towards the vapor channel $A=L_p h$ are known, where e is the wick porosity, h is the height of the vapor layer, and Δt is the time scale of flow. However, the length Δx in which the vapor flows through the wick element is a function of the heat transfer element size, and must be computed with an integral. EQ. 2 computes the average length $\Delta x_{avg}$ over the extent of the vapor channel network area that the vapor travels for a given pillar size.

$$\Delta x_{avg} = \frac{\int \Delta x dA}{A} = \frac{\int_0^{Lp/2}\left(\frac{L}{2}-x\right)8\,xdx}{L_p^2} = \frac{Lp}{6} \quad \text{(EQ. 2)}$$

Therefore, in total the expression for pressure drop is given by:

$$\Delta P = \frac{\mu_l}{6K\Delta t}L_p^2 \quad \text{(EQ. 3)}$$

Since this formulation is an approximation, it may be misleading to compare absolute pressure drops. Therefore, EQ. 4 defines the vapor buildup factor according to:

$$f_{vb} = -\frac{6K\Delta P\Delta t}{\mu_l L_{norm}^2} = \frac{L_p^2}{L_{norm}^2} \quad \text{(EQ. 4)}$$

The vapor buildup factor is a normalized pressure drop to isolate the dependence on the vapor pillar length and easily compare between different sized heat transfer elements. In summary, the vapor buildup factor in accordance with embodiments is plotted in FIG. 5, displaying an $L^2_p$ dependence. Accordingly, in many embodiments a low value of $L_p$ is desired as it results in the vapor having less flow resistance to escape into the channels, thereby limiting vapor buildup in the wick element.

Figure 6:
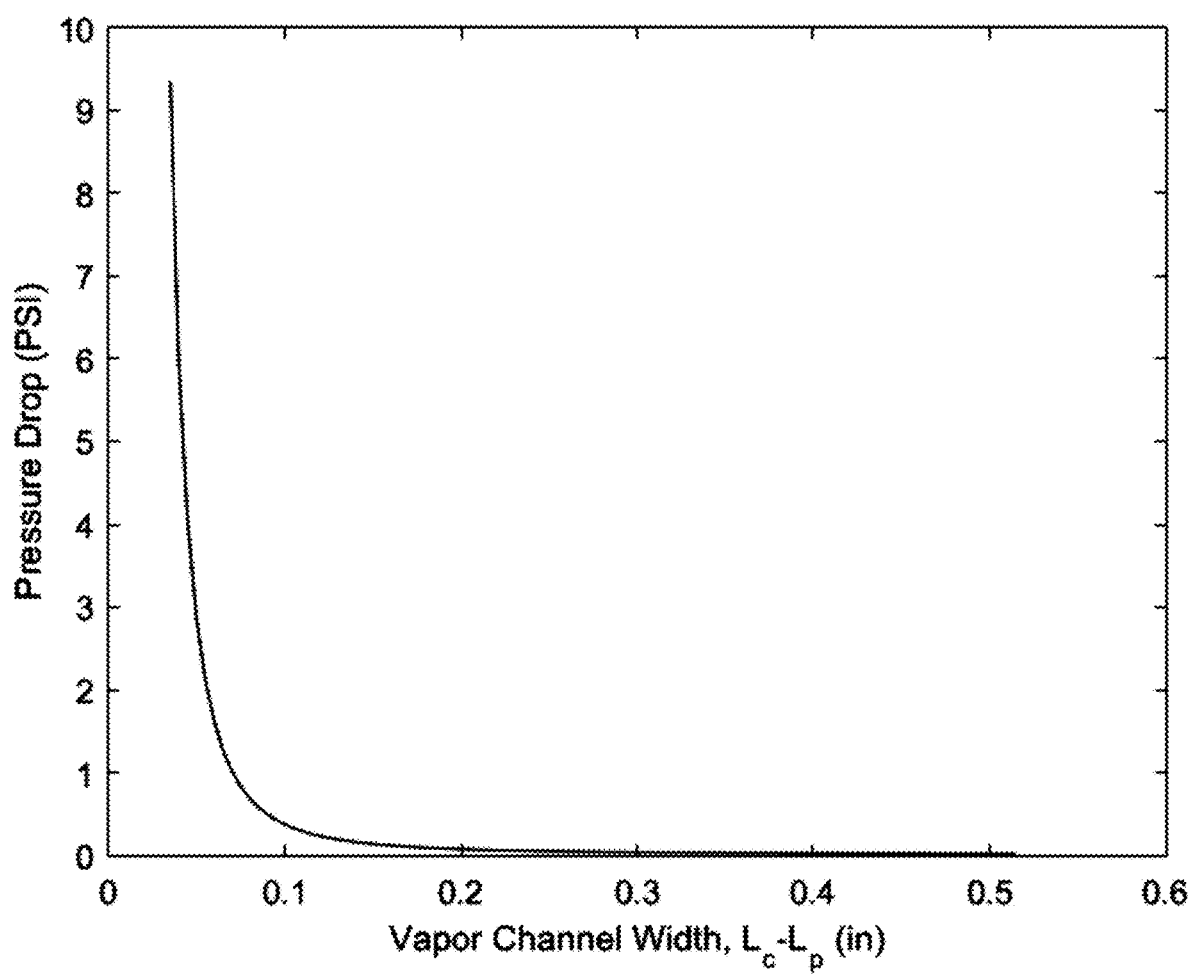
FIG. 6 provides a data plot of the pressure drop as a function of the vapor channel width, or Lc–Lp according to embodiments.

Pressure Drop in Vapor Channels:

The final consideration is the pressure drop through the vapor channels, given by EQ. 5. Because the density of vapor is so much lower than that of the liquid, the vapor pressure drop can become significant due to a strong dependence on hydraulic diameter. This outlines another inherent trade-off between maximizing the area of contact with the wick element for high heat transfer versus minimizing the pressure drop with larger sized channels. That is, as $L_p \rightarrow L_c$, the pressure drop approaches infinity due to the $D^{-4}_{hyd}$ dependence in EQ. 5. In short, the pressure drop through the channels goes approximately as $(L_c-L_p)^{-4}$ as shown in FIG. 6. Accordingly, in many embodiments, excessively small channels are avoided to provide a reasonable pressure drop.

$$\Delta P_{vap} = 128\frac{\mu_v L_{eff} V}{\pi D_{hyd}^4} \quad \text{(EQ. 5)}$$

Accordingly, in designing the heat transfer network of the evaporator in accordance with embodiments, one should go from most to least sensitive to determine acceptable operating conditions. First, looking at FIG. 6 showing the absolute pressure drop values, a sharp increase occurs prior to 0.100". A large pressure drop would compensate the isothermality of the system due to the strong dependence of saturation temperature on saturation pressure. In addition, even with the ability of the pump to account for these losses, avoiding such a steep slope by an incremental increase in channel width would be worth the pumping power saved. Therefore, in various embodiments, the vapor channel width $(L_c-L_p)$ is recommended to be from 0.100" to 0.200", and in some embodiments around 0.125" for ease of manufacturing.

Figure 4:
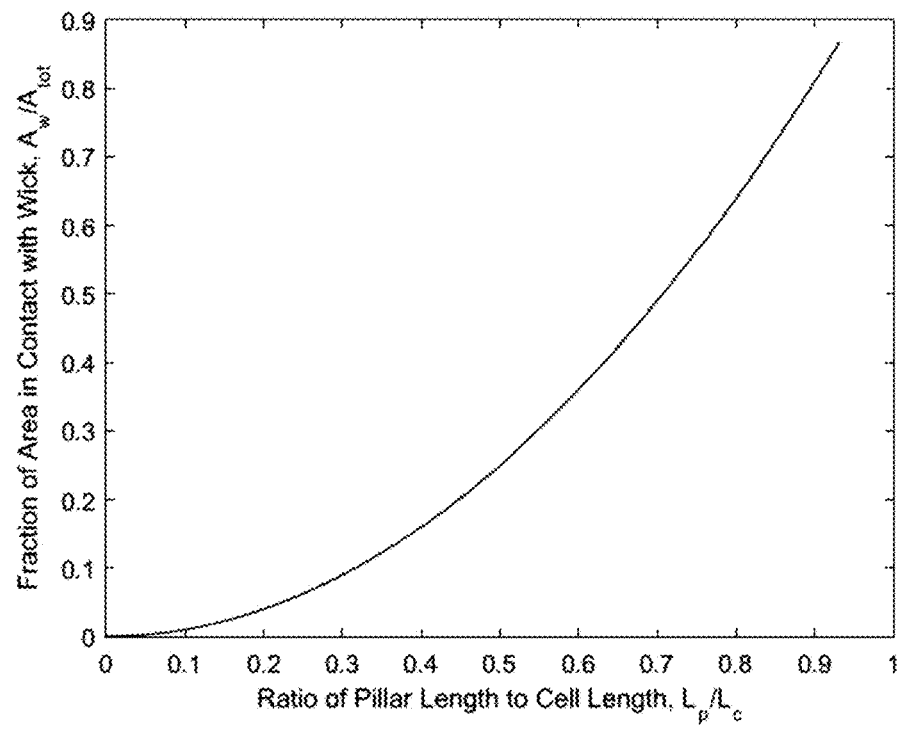
FIG. 4 provides a data plot of the fraction of the heated surface in contact with the wick as a function of the pillar length to cell length ratio according to embodiments.
Figure 5:
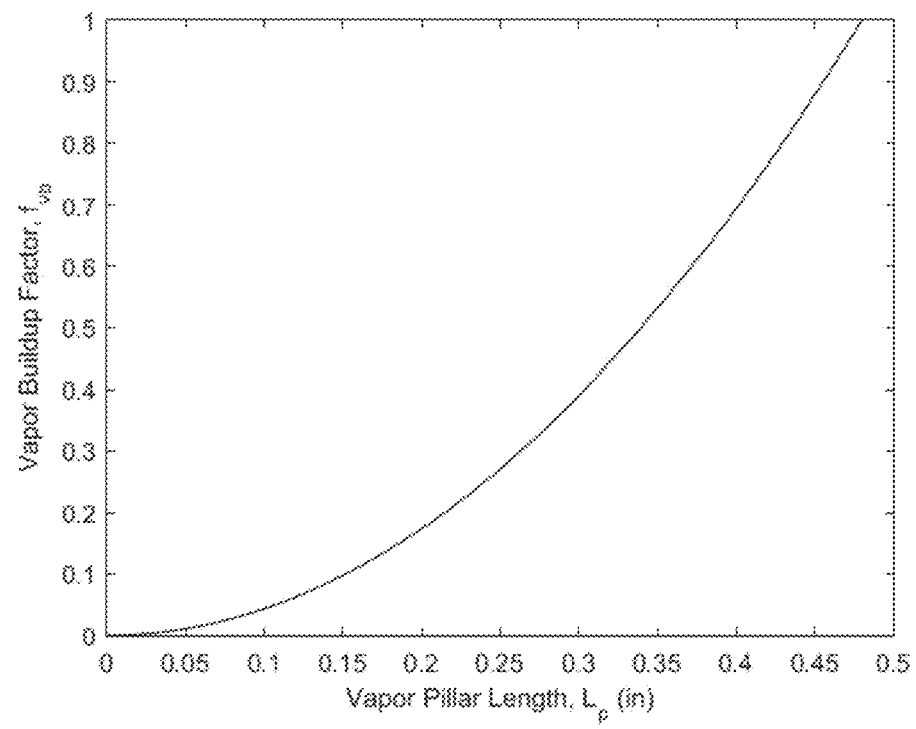
FIG. 5 provides a data plot of the vapor buildup factor, which is a normalized pressure drop of vapor flow through the wick, as shown in EQ. 4 according to embodiments.

With this value chosen, in many embodiments, it is prudent to consider FIG. 5. The slope of the vapor buildup factor begins to increase more substantially at around $L_p=0.300$". With the value of $(L_c-L_p)$ taken to be 0.125" as before, this would correspond to a value of $L_c/L_p$ of from 0.5 to 0.8, and in some embodiments around 0.7, and the wick element area coverage as seen in FIG. 4 would be around 50%. This is not ideal for area coverage, but the incremental increase in the vapor buildup factor is estimated to be equivalent to the incremental decrease in the wick area coverage due to the similar dependence on $L_p$. Therefore, to submit to the tradeoff of these two effects, in embodiments, a heat transfer element length $L_p$ in accordance with embodiments is recommended to be from around 0.250" to 0.400", and in some embodiments around 0.310" in order be compatible with the wick size.

Thermal Contact of Wick with Vapor Pillars

Another consideration for the evaporator according to embodiments is to have a low thermal contact resistance between the wick element and the heat transfer elements. Without sufficient conductance, the path of least resistance would be through the vapor and negate the effect of having a wick element provide liquid to the heated surface. Therefore, in embodiments a few measures may be employed in order to promote strong thermal contact.

First, although the heat transfer elements are square in shape in the figures any suitable shape may be used, such as for example, circular, oval, octagonal, etc. Regardless of the shape, the edges of heat transfer elements could be protruding and prevent contact with the majority of the square face. To remedy this, in many embodiments an edge break less than 0.010" in the vapor channel network may be used, which takes some material off the edges of the squares to uncover the large flat surface of each heat transfer elements. Additionally, as described above, a series of depressions may be formed throughout the face of the evaporator cap to provide a small preload force over the area of the wick element by resilient elements (e.g., compression springs\), which will press the surface of the wick into contact with the heat transfer elements. In many embodiments, the wick element may be made compliant enough to bend slightly and more cleanly contact with the heat transfer elements. In alternative embodiments, a thermal interface material may be interposed between the wick element and the heat transfer elements to further enhance the thermal contact.

Pressure Vessel Considerations

Because there will be a pressure differential between the ambient conditions and the evaporator chamber, the evaporator must be structurally sound to avoid failure. Yet, the goal is to have the heated surface be as thin as possible to reduce the thermal mass for a more efficient design. To ensure structural safety, simulations in Solidworks were performed, applying a pressure force corresponding to 15 PSI on the inner chamber. In many embodiments, a thickness of 0.225" was chosen for the heated surface, which provides a safety factor of 2.5.

Variable Porosity Wick Elements and Methods of Manufacture

As previously discussed, multi-phase heat, transfer systems and evaporators can provide order of magnitude improvements over single-phase systems in terms of system resource usage. In addition, it can be enabling for future instruments by lowering the thermal-related noise floor through its high degree of temperature stability. However, the thermal management technologies rely on the proper management of liquid, vapor, and sometimes-solid phases of the heat transfer fluid through a porous wick element. Conventional wick elements use sintered metals having homogenous porosity. As shown in the figures discussed thus far, these wick elements are made separately and integrated into heat acquisition and heat rejection devices, such as evaporators.

The limitations associated with such conventional sintered, homogenous wick elements include that the wick element needs to be manufactured separately from the rest of the heat transfer device, which results in limitations to the device geometry. In addition, being a separate element, additional thermal interfaces are introduced which have significant influence on the proper operation of the heat transfer device. Thermal contact resistances and fluid leak paths are also introduced using such separate elements. Finally, sintered metal wick elements cannot precisely and accurately control the variability of the porosity through the media. As a result, sintered wick elements are generally homogenous, monolithic media, which limits custom device design. Moreover, the gains achieved through enhanced wetting and capillary pressure generation are limited by the relatively high pressure drops associated with flow through low porosity media.

Figure 7:
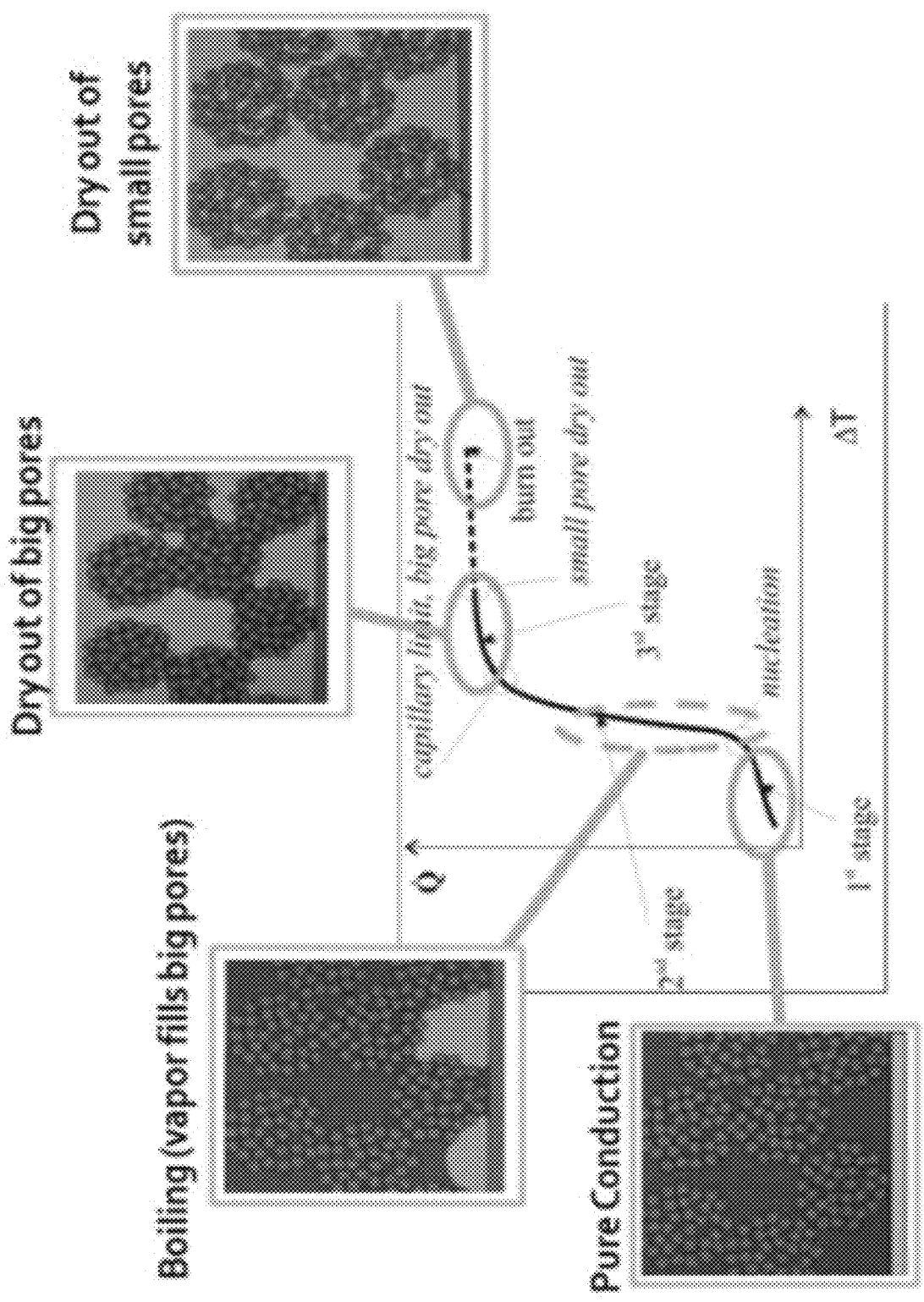
FIG. 7 provides a data plot of the critical heat flux of a variable porosity wick element according to conventional technology.
Figure 8A:
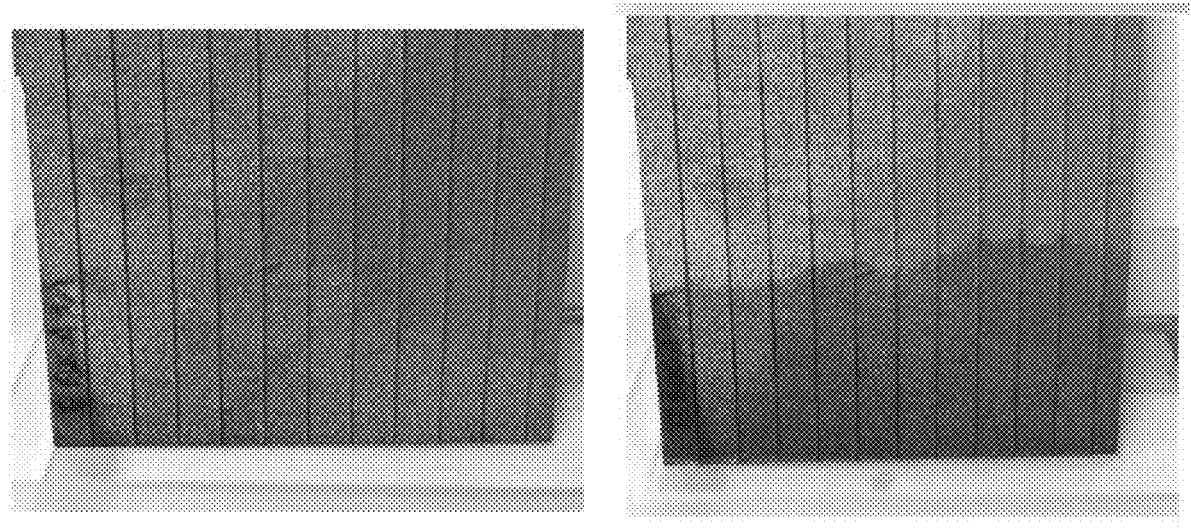
FIG. 8a provides images of 3-D printed porous wick elements according to embodiments at time zero (top) and a few seconds later (bottom) after contact with an isopropanol liquid.
Figure 8B:
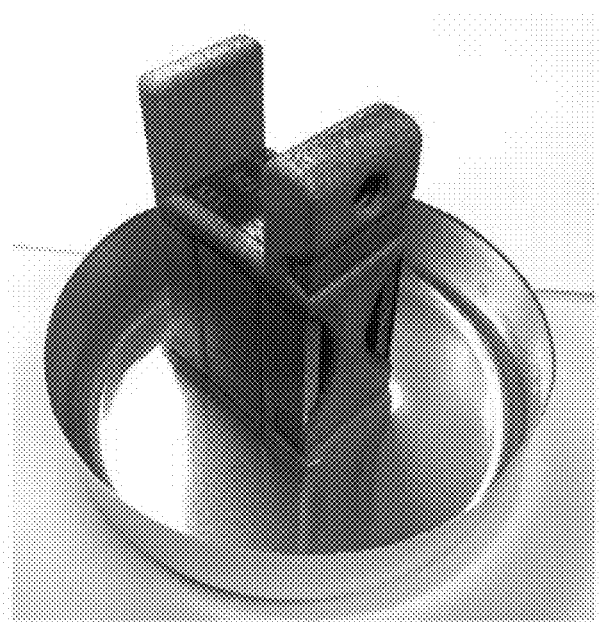
FIG. 8b provides an image of a multi-porous wick element structure made from 3-D printed aluminum according to embodiments, where liquid wicking rates are shown to vary, which is indicative of successful bi-porosity on a monolithic part.

Accordingly, many embodiments incorporate variable porous wick elements. The benefit to the critical heat flux limit associated with variable porous wick elements is depicted in FIG. 7. In various such embodiments, advanced manufacturing techniques, such as, for example, additive manufacturing techniques may be used to form wick elements having monolithic and variable porosity structures. In some such embodiments, electron beam and laser sintering associated with metal 3-D printing techniques may be used to produce porous metal (e.g., titanium, aluminum, etc.) structures having excellent wicking capability. Exemplary wick elements are shown in FIG. 8a (which shows a 3-D printed porous structure made from titanium) and FIG. 8b (which shows a multiporisity structure formed from aluminum).

Embodiments utilizing such additively manufactured, variable porous wick elements can enable new classed of heat transfer devices. In such embodiments, the wick element structure need not be limited to an incremental set of porosities but rather can be continuously variable. In many such embodiments, porosity gradients may be utilized for improving the performance of traditional evaporators as well as allowing for the creation of evaporator structures of any conformation. For example, unlike conventional evaporator structure, which are constrained by the wick element to be planar, the wick element, and, in turn, the entire evaporator can be configured to conform precisely to the components from which heat needs to be transferred. In addition, because the wick element can be directly formed and integrated with the rest of the evaporator such that it can be directly integrated with the supporting components, including, but not limited to, the heat transfer elements, evaporator walls, inlets and outlets, etc. Accordingly, in such embodiments supportive elements such as the resilient members can be eliminated allowing for volume and mass savings.

Mixed-Phase & Single-Phase Configurations

Figure 9:
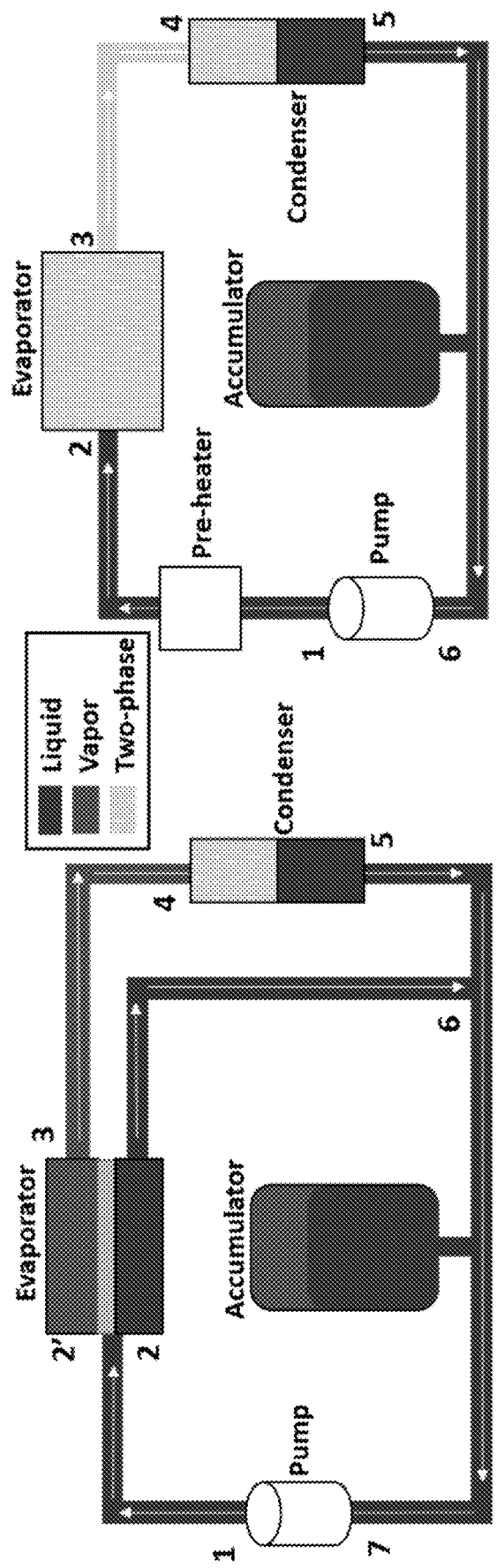
FIG. 9 provides a schematic of a basic Separated Flow Architecture (SFA) system (left) and a Mixed Flow Architecture (MFA) system (right), where the fluid flows in the direction of the ascending numbers according to embodiments.

Although the above discussion has focused on the design of the multi-phase evaporator and its various components, it should be understood that embodiments are also directed to large thermal transfer systems incorporating such evaporators. Specifically, embodiments of evaporators may be incorporated into two different mechanically pumped multi-phase thermal control systems: separated flow systems or mixed flow systems. In mixed flow systems (MFA), two-phase flow exits the evaporator with the thermodynamic quality varying with heat load. In separated flow systems (SFA) the liquid and vapor phases are kept separated in dedicated liquid and vapor lines. A schematic of these two architectures in their simplest form is shown in FIG. 9. As shown, in many embodiments both architectures contain the same basic elements: a pump (to circulate the working fluid), an evaporator (to pick up the heat load), a condenser (to reject the heat load), and an accumulator (to regulate system pressure).

Figure 10A:
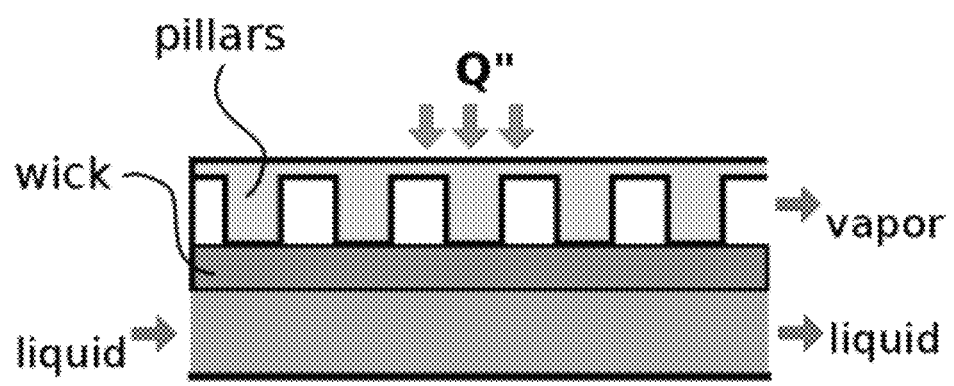
FIGS. 10a and 10b provide schematics of a SFA evaporator (10a) and MFA evaporator (10b) according to embodiments.
Figure 10B:
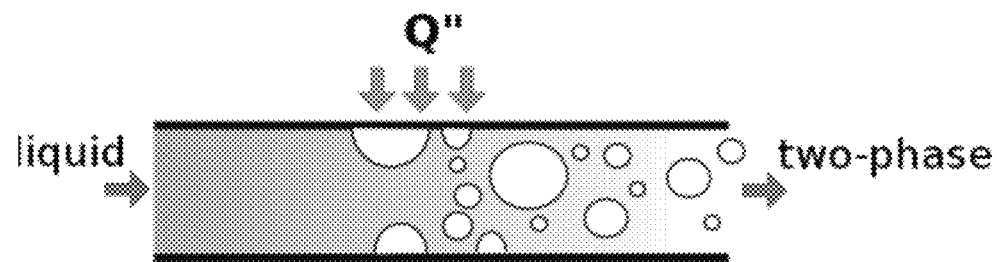

In conventional thermal transfer systems, the primary difference between the two architectures lies in the design of the evaporator. In the SFA, the evaporator additionally functions as a phase separator and has two outlets: one for vapor and one for liquid. In such configurations, there is a liquid chamber and vapor chamber that are separated by a porous wick element, which maintains the liquid-vapor interface. The evaporator acquires heat through the vapor chamber side by evaporating fluid at the liquid-vapor interface. In conventional MFA designs, the vapor and liquid phases are not separated in the evaporator and consequently two-phase flow occurs both in the evaporator and in the flow line between the evaporator and condenser. In its simplest form the MFA utilizes flow boiling in the evaporator. FIGS. 10a and 10b schematically illustrate basic forms of the SFA (10a) and MFA (10b) evaporators. The difference in evaporator design between the two architectures typically leads to significant operational differences.

Figure 11A:
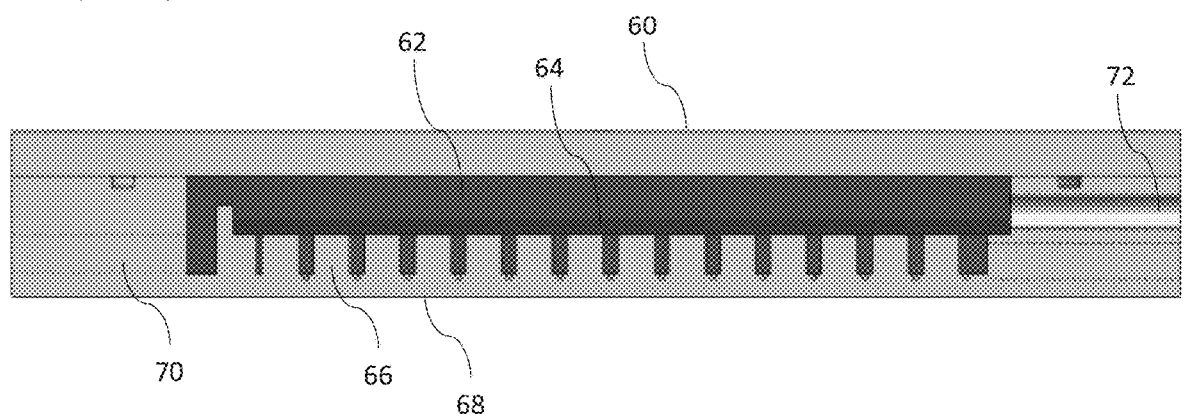
FIGS. 11a and 11b provide section views of the evaporator design for the SFA (11a) and SFA testbeds (11b) according to embodiments.
Figure 11B:
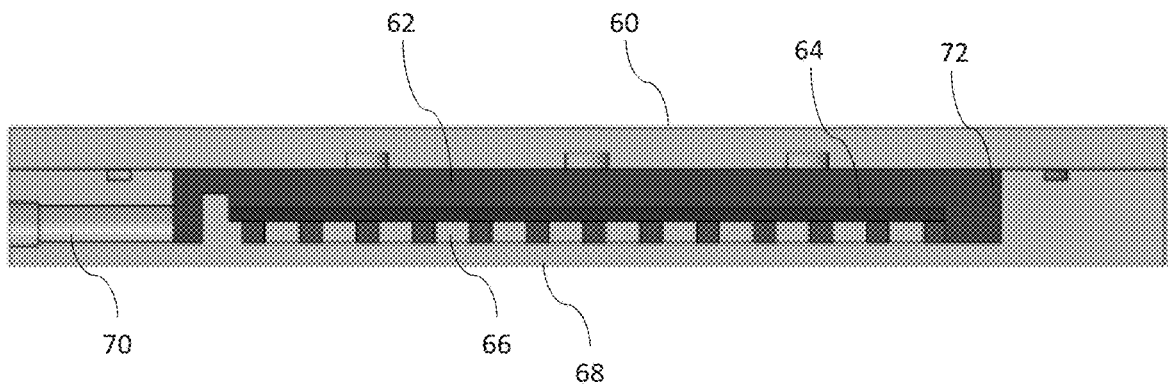

According to embodiments of thermal control systems according to the disclosure a single evaporator design is used where variations in the outlet configurations allow for operation of the evaporator in either a SFA or MFA architecture. FIGS. 11a and 11b provide cross-sectional schematics of the evaporator in both configurations that illustrate the principle of operation. As shown, in embodiments, both evaporator configurations (60) consist of a single chamber (62) that is divided by a porous wick element (64). The wick element is pressed against heat transfer element (66) which are connected to the heated surface (68). These heat transfer elements transfer heat to the wick element and cause evaporation of the working fluid at the pillar/wick interface. During operation, vapor is formed on the heat transfer element side of the wick element and flows downstream toward the evaporator outlet. On the other side of the wick, liquid flows from the evaporator inlet (70) to the outlet (72) in a parallel path. As shown in FIG. 11a, in the SFA, the wick element (64) extends across the entire length of the fluid reservoir within the evaporator body such that the liquid and vapor streams remains separated throughout the entire evaporator. As shown in FIG. 11b, in the MFA, liquid and vapor streams are separated by the porous wick element until they recombine near the outlet (72) of the evaporator.

Apart from the differential configuration of the liquid and vapor streams at the outlet to the evaporator, in both embodiments the wick element serves two primary purposes: first it ensures that the heated surface remains wetted in a microgravity environment (to avoid dry out), and second it helps keep the heated surface isothermal by constraining the vapor flow to be next to the heated surface. For the SFA design, it has the additional function of serving as a phase separator.

Figure 12:
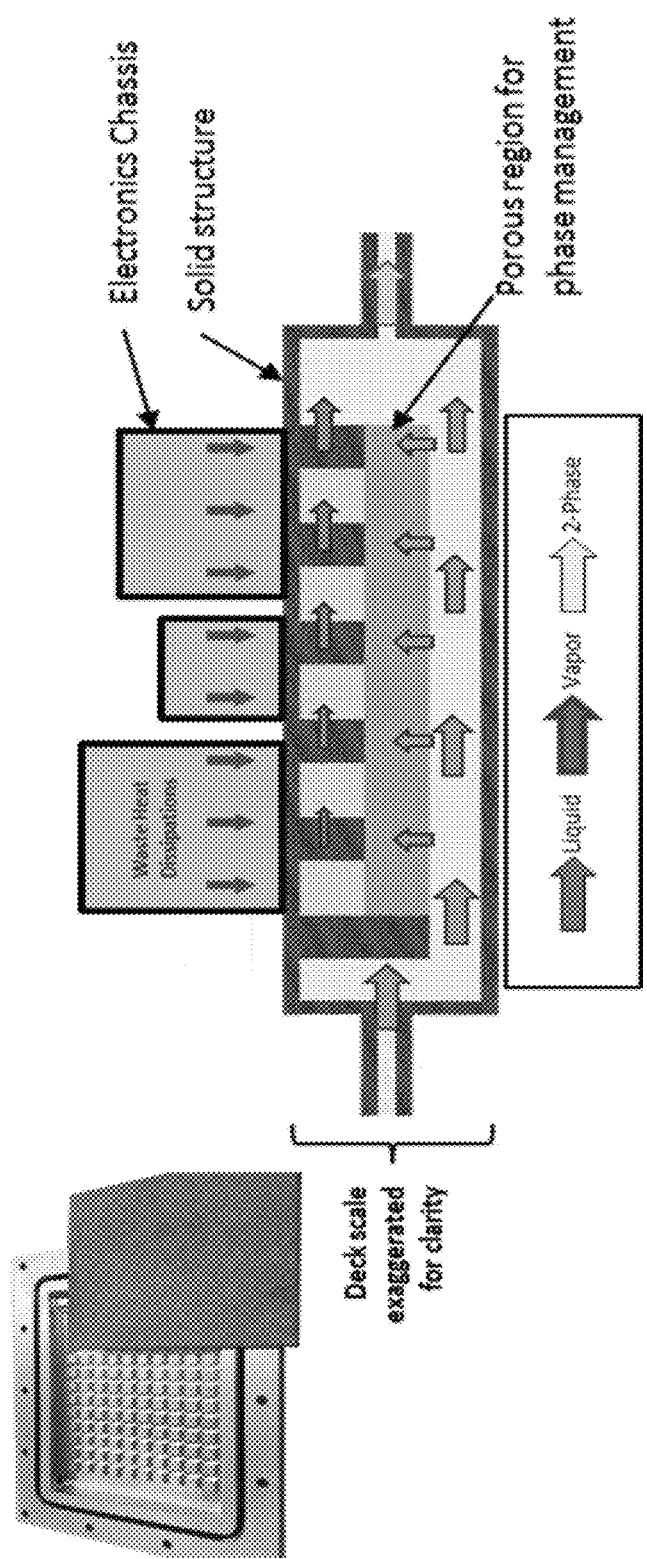
FIG. 12 provides a schematic of the operation of a MFA evaporator according to embodiments.

Accordingly, embodiments of the multi-phase evaporator may be utilized in either SFA or MFA thermal transfer system architectures with a minor modification of the evaporator configuration. As shown schematically in FIG. 12, in both configurations cooling liquid comes through the central inlet port on the left, spreads, and fills the cooling liquid reservoir channel. As the liquid fills the channel, the porous wick element takes in liquid over its entire area until it saturates. As the heat source(s) is being applied to the heat transfer elements, the heat is conducted through the heat transfer elements to the wick element. As the wick element is heated the cooling fluid is evaporated at the surface of the wick element adjacent to the vapor channels, and the vapor is released into the vapor channel network. This vapor then spreads and percolate through the network of channels, spreading away from the heated area and avoiding superheating. Meanwhile, the wick element helps re-wet the evaporated area through its liquid spreading power. The only difference between the evaporator configurations is what happens to the liquid and vapor in exiting the evaporator. In an MFA system (shown) the vapor rejoins the excess liquid and exits the evaporator on the right, whereas in an SFA system (not shown) the vapor and liquid would remain separated and exit through separate outlets.

EXEMPLARY EMBODIMENTS

Experiments were conducted to demonstrate the capabilities of the evaporators and thermal control system in accordance with embodiments. These results and discussion are not meant to be limiting, but merely to provide examples of operative devices and their features.

Example 1: Thermal Control System Configurations

Figure 13:
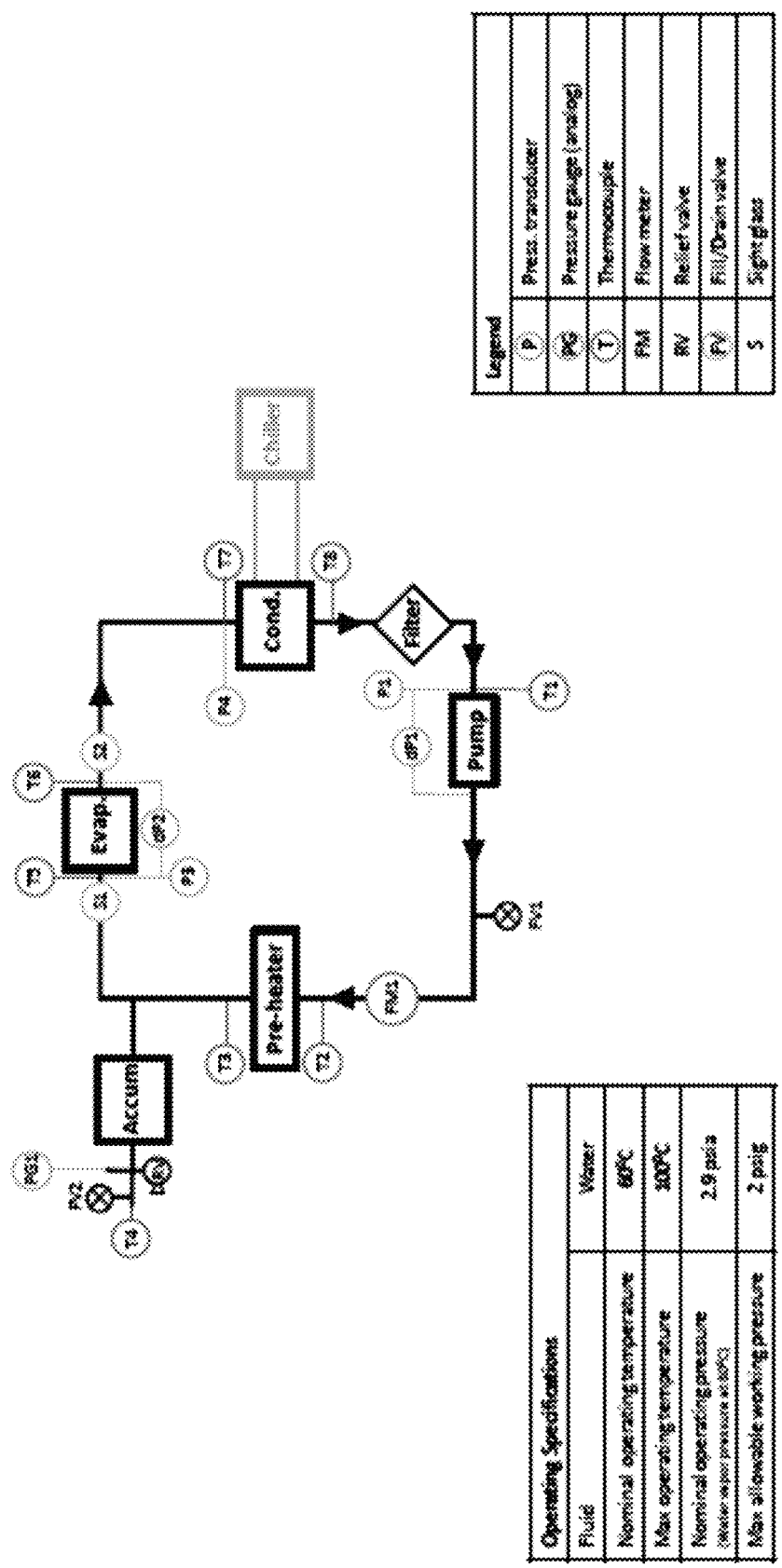
FIG. 13 provides a schematic of a mechanically pumped two-phase cooling loop with system operating conditions according to embodiments.

Many exemplary embodiments are directed to determining configurations for the evaporator. In making such configuration determinations, the operating conditions must be determined. In these exemplary embodiments, the working fluid will be water. Since the focus of the evaporator is the performance of the boiling heat transfer, the system is also assumed to operate in saturated conditions. Lowering the system pressure to be less than atmospheric also allows for a lower saturation temperature and therefore will minimize the amount of heat loss interaction with the surrounding ambient conditions. To avoid pump cavitation, the system needs to be at a reasonable absolute pressure, varying depending on the pump specifications. With these considerations in mind, the operating temperature will be assumed to be approximately 60° C., which corresponds to a vapor pressure of 2.9 psia. FIG. 13 provides a summary of the experimental setup.

Heat Loads and Flow Rate:

To determine the expected pressure drop across the evaporator, it is helpful to know the flow rate. In a two-phase system, the flow rate is directly linked to the heat load. For the spacecraft payloads being considered, the low heat fluxes of around 5 W/cm² correspond to heat loads of around 500-1000 W total. Because of the selection of water as a working fluid, the high heat of vaporization results in extremely low flow rates on the order of 15-30 mL/min required to remove all of the heat from the heat sources. For practical purposes of keeping the wick wetted, the testing will operate at an excess flow rate, meaning not all liquid will be converted to vapor. Therefore, the design range for flow rate is chosen to be 40-80 mL/min.

Figure 14:
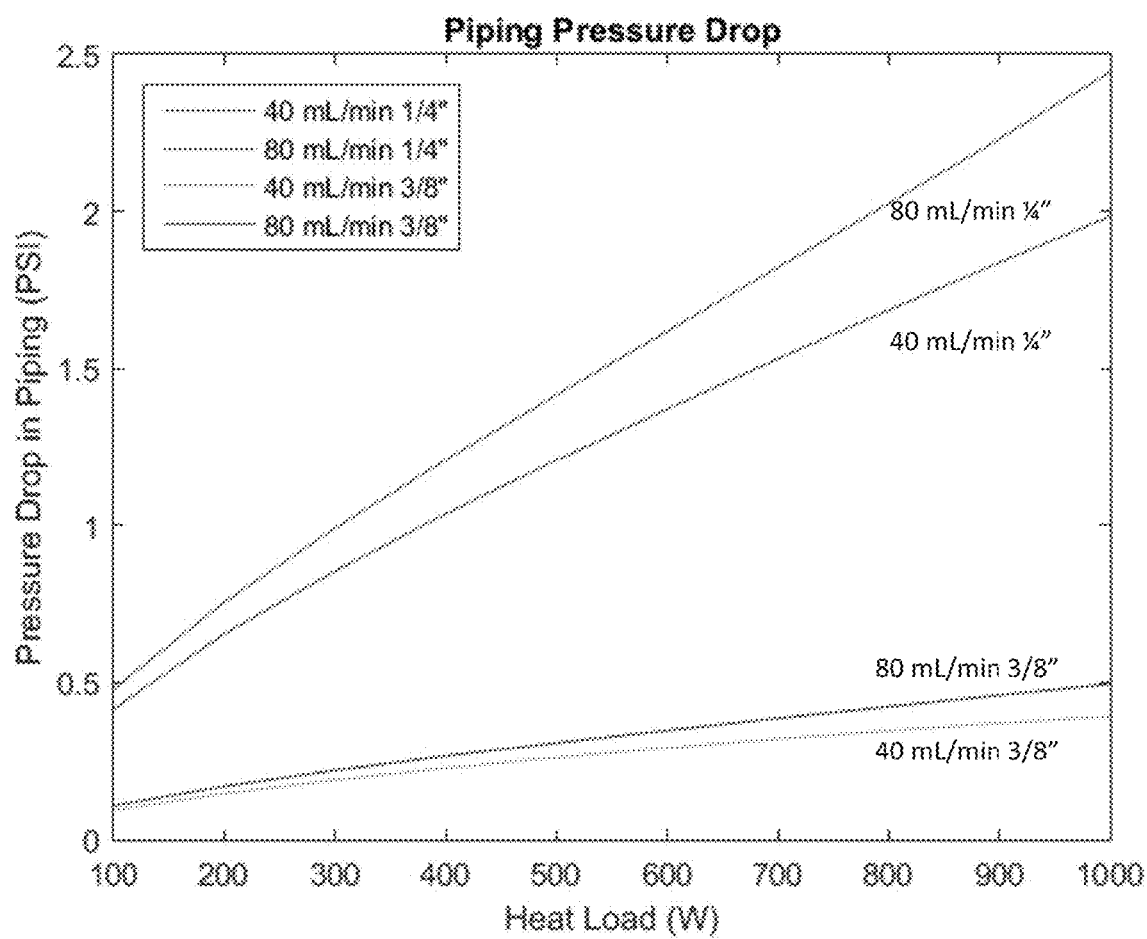
FIG. 14 provides a data plot of the expected pressure drops in piping of entire cooling loop are shown for two different flow rates and pipe inner diameters (assumed dimensions are 12 feet of piping, with 25% two-phase flow for the section between the evaporator and condenser, and 75% liquid flow in the remaining piping sections) according to embodiments.
Figure 15A:
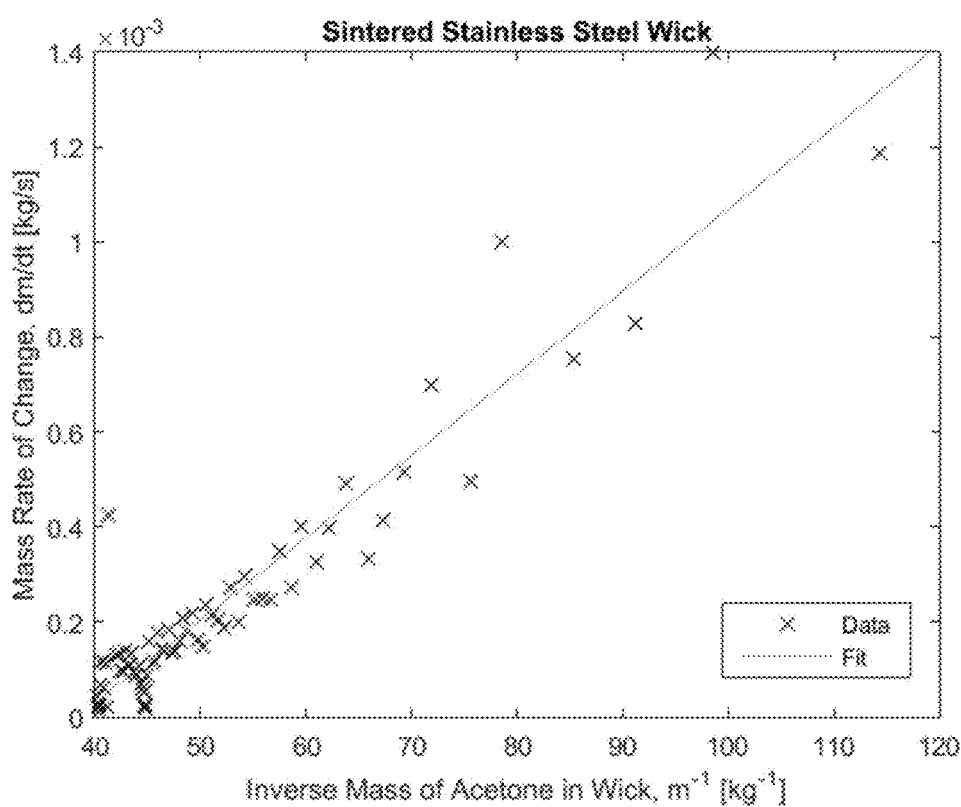
FIG. 15a provides a data plot taken from rate of rise test for stainless steel wick (where slope and intercept are used to determine permeability and pore size) according to embodiments.
Figure 15B:
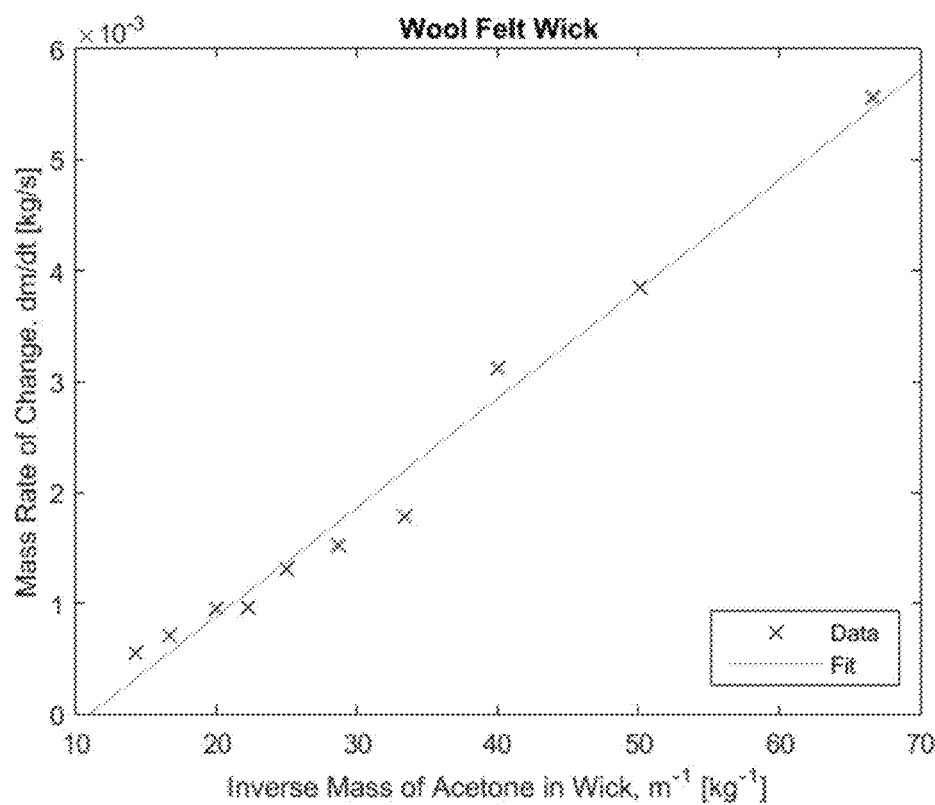
FIG. 15b provides a data plot taken from rate of rise test for wool felt wick (where slope and intercept are used to determine permeability and pore size) according to embodiments.
Figure 15C:
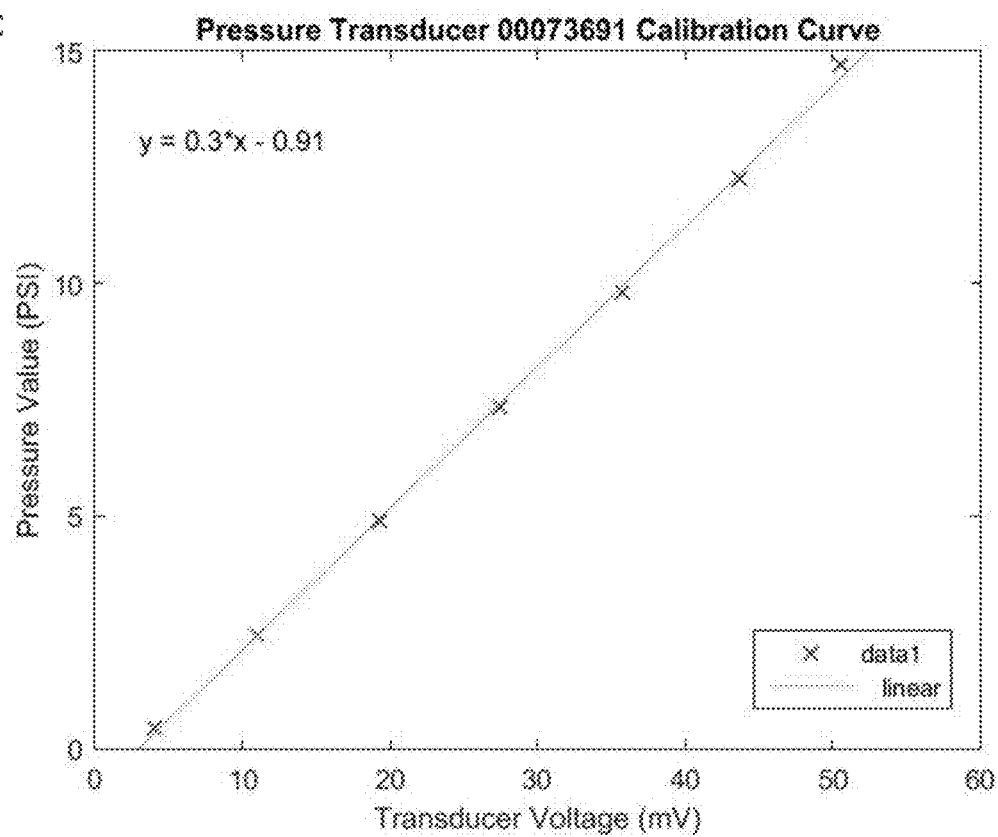
FIGS. 15c and 15d provide data plots of linear fit calibration data according to embodiments.
Figure 15D:
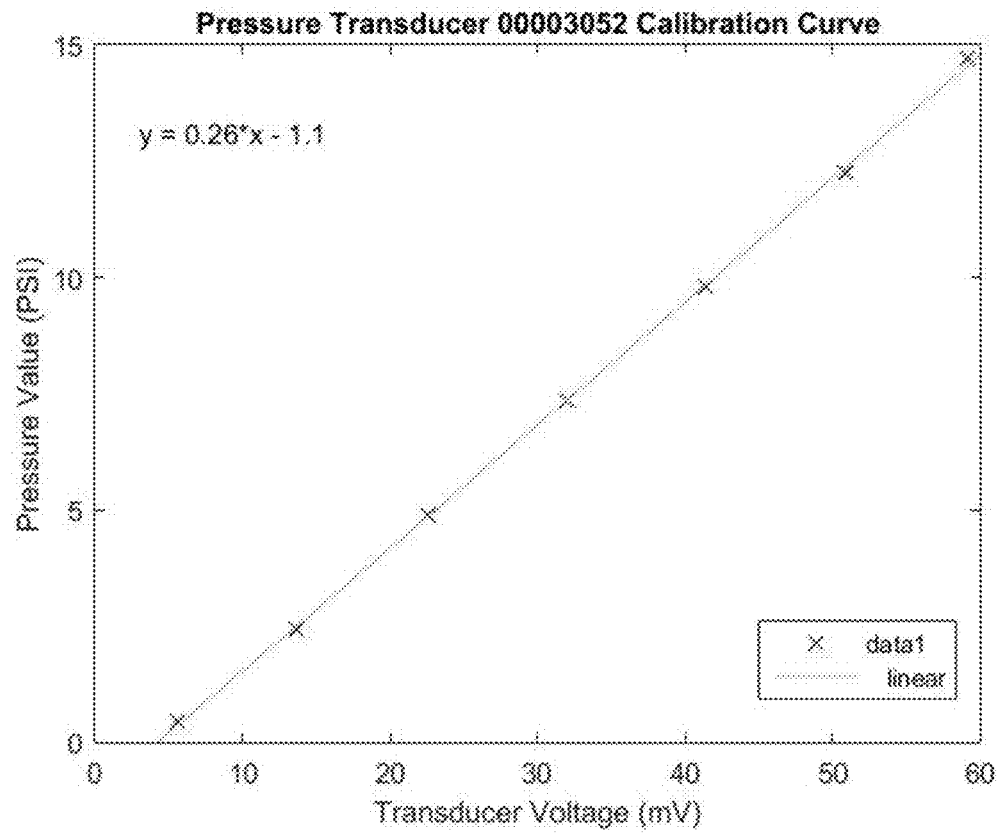

Pressure Drops in Piping:

As a point of reference for designing the allowable pressure drop across the evaporator, it is worthwhile knowing approximate values of the pressure drop through the piping of the cooling loop. The following subsections describe the methodology used to determine the pressure drop of each tubing section, added together to yield FIG. 14. Because of the low flow rate, the pressure drops in the piping are generally small and acceptable, which allows for design flexibility with regards to the evaporator features.

Pressure Drop in Liquid Section:

Assuming laminar flow, the normal friction factor formulation can be used to determine the pressure drop for the liquid only section, with liquid viscosity $\mu_l$, length of liquid piping $L_{liq}$, volumetric flow rate $\dot{V}$, and pipe inner diameter $D_i$, as provided in.

$$\Delta P_{liq} = 128 \frac{\mu_l L_{liq} \dot{V}}{\pi D_i^4} \quad \text{(EQ. 6)}$$

Pressure Drop in Two-Phase Section:

For predicting the pressure drop in the two-phase section, the separated flow model shown in EQ. 7 below was used, with the Lockhart and Martinelli correlation for determining void fraction and the Friedel correlation for determining the two-phase multiplier. (See, e.g., Carey, V. P. Liquid-vapor phase-change phenomena (1992); Lockhart, R. & Martinelli, R. Chem. Eng. Prog 45, 39-48 (1949); Friedel, L. *In European two-phase flow group meeting, Paper E*, vol. 2, 1979 (1979), the disclosures of which are incorporated herein by reference.)

$$\frac{\Delta P}{\Delta z} = -\frac{1}{\Lambda}\left[\left(\frac{dP}{dz}\right)fric + \left(\frac{dP}{dz}\right)grav + \left(\frac{dP}{dz}\right)acc\right] \quad (EQ. 7)$$

Wick Characterization:

In attempts to achieve the goals of obtaining surface isothermality and liquid spreading for improved wetting of the heated surface, the use of a wick element for its capillary action is explored. Unlike in heat pipes where the wick provides the driving potential of the entire cooling loop, here the wick's purpose is to more effectively supply liquid to locations of discrete heat loads, where vapor concentration would otherwise take place. The important wick characteristics are the porosity $\varepsilon$, the permeability K, and the pore size $r_{eff}$. The evaporator was designed around a 5.5"×6.5"×0.25" sintered stainless steel 316L wick, with an equivalently sized Hard Off-White S2 Felt wick from McMaster also to be tested.

Porosity:

To estimate the porosity, the procedure presented in Holley and Faghri may be used. (See, e.g., Holley, B. & Faghri, A. *Applied thermal engineering* 26, 448-462 (2006), the disclosure of which is incorporated herein by reference.) The wick was placed on a scale and acetone was supplied to the wick until it reached saturation. By taking video while slowly filling the wick, the amount of mass at the time of saturation could be determined. Using this mass and the fluid properties, the volume fraction of pores can be found using EQ. 8, $$\frac{1}{\varepsilon} = 1 + \frac{V_{wick}\rho_a}{m_a} \quad (EQ. 8)$$

where $V_{wick}$ is the total volume of the wick sample, $\rho_a$ is the density of acetone and $m_a$ is the amount of mass added at the time of saturation. The values are presented in the Table 1, below.

TABLE 1

| Property | Stainless Steel | Wool Felt |
| --- | --- | --- |
| Rated Pore Size (μm) | 60 | 12 |
| Pore Size (μm) | 59 ± 10 | 14 ± 2 |
| Rated Permeability (×10⁻¹⁰ m²)* | 0.05 – 0.5 | N/A |
| Permeability (×10⁻¹⁰ m²) | 0.4 ± 0.1 | 0.8 ± 0.2 |
| Rated Porosity* | 0.28 – 0.35 | N/A |
| Porosity | 0.34 ± 0.03 | 0.36 ± 0.04 |

Pore Size and Permeability:

To solve for the pore size and permeability of a given wick, a rate of rise test was performed, as also outlined in Holley and Faghri, cited above. This entailed dipping a wick sample into acetone and measuring the amount of liquid that enters the wick over time. If the wick is light colored, this can be accomplished simply by visually observing the height of the wicked fluid as it rises. However in many wicks, especially metal samples, it is difficult to visualize the liquid level in the wick, so the mass is measured over time. In the rate of rise test, the capillary pressure $\Delta P_c$ of the pores works against the gravitational head $\Delta P_g$ and the viscous pressure drop $\Delta P_w$ through the wick according to:

$$\Delta P_c = \Delta P_w + \Delta P_g \quad (EQ. 9)$$

Using the Young-Laplace equation, Darcy's Law, and hydrostatic pressure, EQ. 9 can be manipulated into EQ. 10, which is to be used if measuring the mass rate of change by way of taking video of a scale reading. Parameters include m as the mass of acetone over time, σ as the surface tension of acetone, A as the cross sectional area, and g as the acceleration due to gravity.

$$\frac{dm}{dt} = \frac{2\sigma}{r_{eff}}\frac{K\varepsilon(A\rho_a)^2}{\mu_l}\frac{1}{m} - \frac{g\rho_a^2 AK}{\mu_l} \quad (EQ. 10)$$

If measuring the height of the liquid line over time, by substituting the liquid height $x=m/(\rho_a\varepsilon A)$, the expression reads as follows:

$$\frac{dx}{dt} = \frac{2\sigma}{r_{eff}}\frac{K}{\mu_l\varepsilon}\frac{1}{x} - \frac{K}{\mu_l\varepsilon}\rho_l g \quad (EQ. 11)$$

Therefore, by measuring the slope and the intercept of the time rate of change versus reciprocal plot, and by knowing the fluid properties and porosity, the permeability and pore size can be estimated using the above equations. The values obtained are presented in Table 1. The data are presented in FIGS. 15a to 15d.

Example 2: Mixed Flow Architecture Tests

MFA systems are the typical mechanically pumped two-phase systems. They are commercially available for ground-based systems and have also been developed for use in spacecraft. An MFA is currently being used for the thermal control system of an ISS science payload. (See, e.g., Delil, A. A. M., A. A. Woering, and B. Verlaat. Development of a Mechanically Pumped Two-Phase CO2 Cooling Loop for the AMS-2 Tracker Experiment. No. 2002-01-2465. SAE Technical Paper, 2002, the disclosure of which is incorporated herein by reference.) In these systems, the pump, evaporator and condenser are plumbed in series in a single circuit (see FIG. 9). Liquid flows from the pump to the evaporator where heat is added to form a two-phase flow. A pre-heater at the inlet of the evaporator is often used to bring the working fluid up to the saturated state. Heat is rejected from the flow in the condenser, which outputs sub-cooled liquid back to the pump. The evaporator typically utilizes some form of flow boiling.

Figure 16:
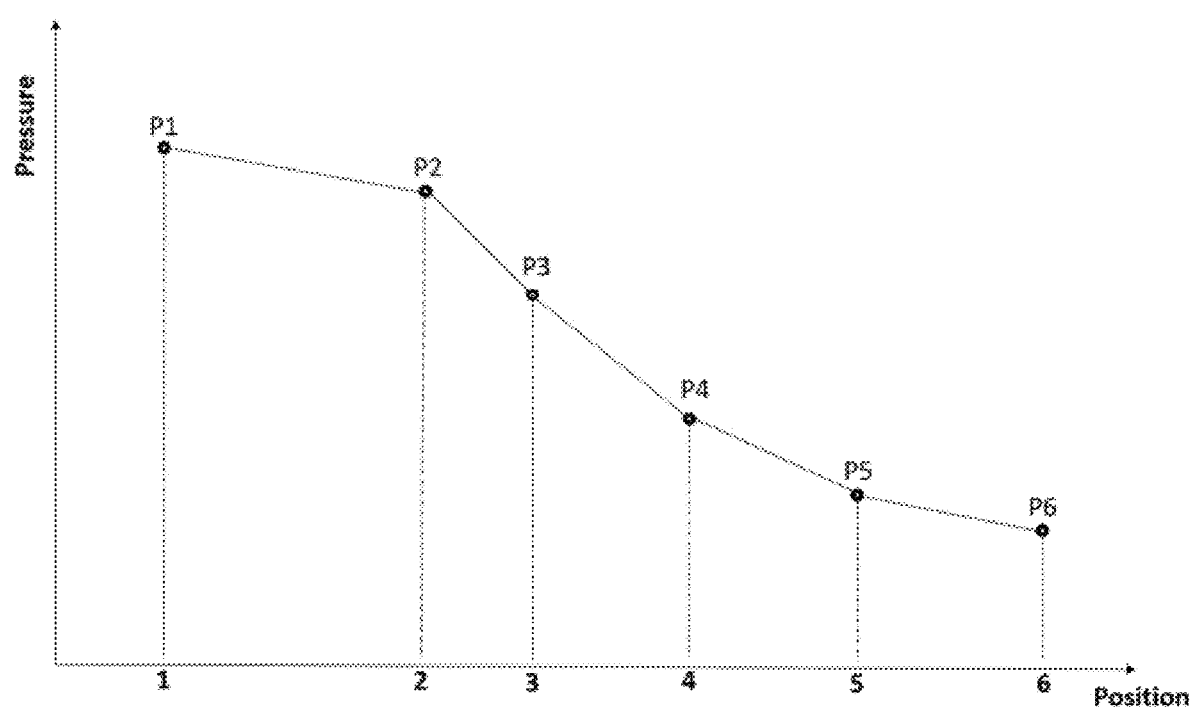
FIG. 16 provides a data plot of pressure vs. position for an MFA system according to embodiments.

FIG. 16 schematically shows a plot of pressure versus position for a basic MFA system. The pressure monotonically decreases from the pump outlet to the pump inlet. The largest pressure drop is in the portion of the system with two-phase flow (from evaporator inlet (2) to condenser outlet (5)). The pressure drop in the liquid lines is relatively small since flow rates are relatively low and the flow is single phase.

Mixed Flow Testbed

Figure 17:
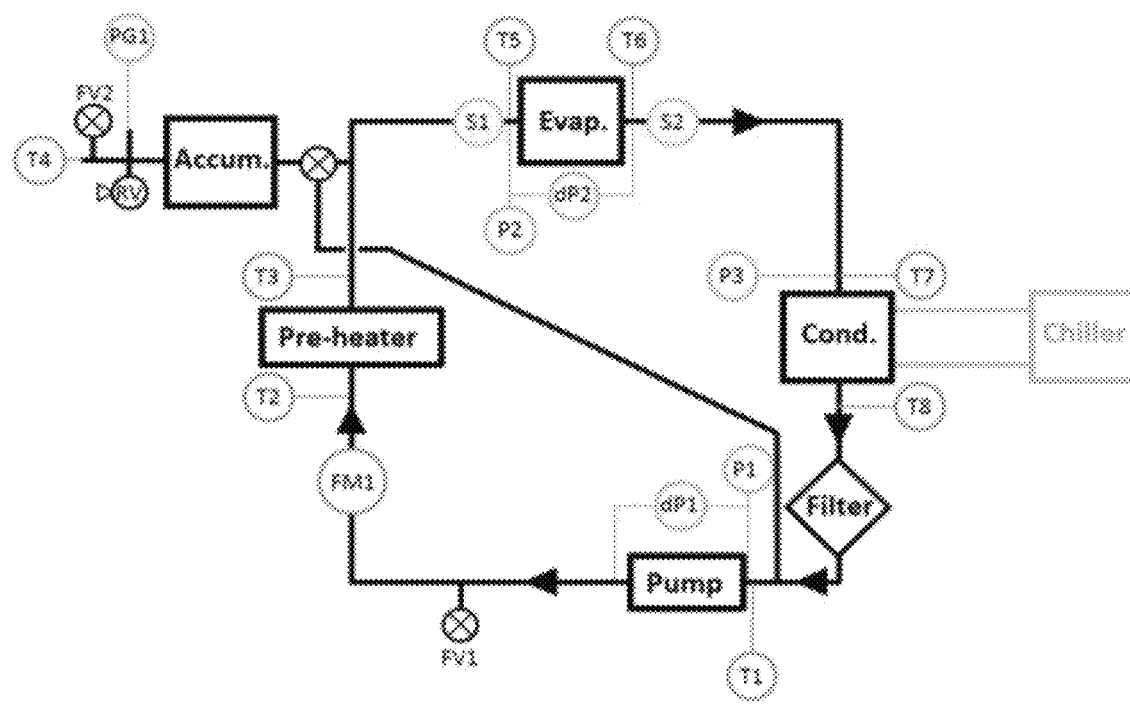
FIG. 17 provides a schematic of an MFA testbed according to embodiments.

In order to experimentally evaluate an MFA system, a simple MFA testbed was designed and built. The goal of the testbed was to enable experimental studies to be carried out in order to evaluate the operation of embodiments of the evaporator in an MFA thermal transfer system. FIG. 17 shows a schematic of the system. The working fluid was circulated in a closed loop through a pre-heater, evaporator and condenser. An accumulator was used to regulate system pressure. The pre-heater consisted of electrical heaters mounted to a cold plate. A flat plate liquid-liquid heat exchanger connected to a chiller was used as the condenser/subcooler. The accumulator consisted of a sample cylinder located at the high point of the physical system. The sample cylinder was partly filled with liquid when the system was charged; its orientation with respect to gravity and high location, ensured that the accumulator remained filled and able to regulate system pressure. Accumulator pressure was either controlled by pre-pressurizing the accumulator with air, or by evacuating the vessel and operating it as a saturated liquid/vapor system. In this case the accumulator pressure was controlled by controlling the temperature using a heater/controller circuit. Plumbing to the accumulator was arranged such that it could be used to fix the pressure either near the evaporator inlet or near the pump inlet. Typically, the accumulator is placed at the pump inlet to ensure that the NPSH requirement is met, however it was thought that by placing it near the evaporator, temporal thermal stability might be able to be better enforced. A gear pump was used to circulate the fluid.

The loop was instrumented to read fluid temperatures and pressures in multiple locations. Flow rate was measured near the pump outlet. Sight glasses installed at the evaporator inlet and outlet were used to visually monitor the thermodynamic quality of the flow. All transport lines were made of 6.35 mm (0.25 in) stainless steel pipe. Water was used as the working fluid for simplicity. The evaporator described above was used in the testbed.

MFA Test Campaign

The MFA testbed was used to experimentally explore the potential of an MFA system and to characterize the evaporator design according to embodiments. Multiple parameters were varied including flow rate, transport line hydraulic resistance, and evaporator orientation with respect to gravity. Flow rate was modulated via changing the pump speed, transport line resistance was varied using an inline needle valve, and the level of preheat was varied using electrical heaters. Changing the evaporator orientation required reinstalling the evaporator in a new orientation. Changing the accumulator position entailed opening and closing the correct valves.

During the course of the test campaign, operational settings were found that yielded a fairly isothermal evaporator for a range of heat loads. However, to achieve this required significant heat input in the pre-heater to bring the fluid close to saturation. It was determined that the evaporator was unable to maintain a tolerable level of isothermality if the fluid at the inlet was significantly subcooled.

Several other findings were made in the course of testing: It was found that the accumulator can produce flow instabilities if it is located near the evaporator inlet, and that the evaporator was able to operate with the vapor side facing either down or up. A more detailed discussion of these findings is given below. Throughout the testing, system pressure was maintained between 4 psia and 6 psia to ensure sufficient NPSH for the pump. The liquid return line (exiting the condenser/subcooler) was always subcooled to 20° C.

Steady State Operation with an Isothermal Evaporator.

System parameters were adjusted in order to try to maintain an isothermal evaporator with a range of heat loads, in accordance with the program goals. The accumulator was positioned at the evaporator inlet and flow resistance upstream of the evaporator was increased (using the needle valve) to ensure flow stability. The accumulator pressure was set by reducing the air pressure in the headspace of the accumulator to about 2.5 psia. The flow rate was fixed at 50 mL/min. 140 W were applied to the pre-heater to bring the fluid temperature from about 21° C. up to 60° C. at the evaporator inlet. Four different heat loads were sequentially applied to the evaporator: 200 W, 250 W, 300 W and 395 W. The heater measured approximately 6.5 cm by 15 cm and covered about 17% of the evaporator surface. The evaporator was oriented vapor side down. In principle, this is the more challenging orientation for isothermality since the vapor will tend to rise away from the heated surface due to buoyancy. Key temperatures and pressures were recorded around the loop, and IR images of the evaporator were continually acquired.

Figure 18A:
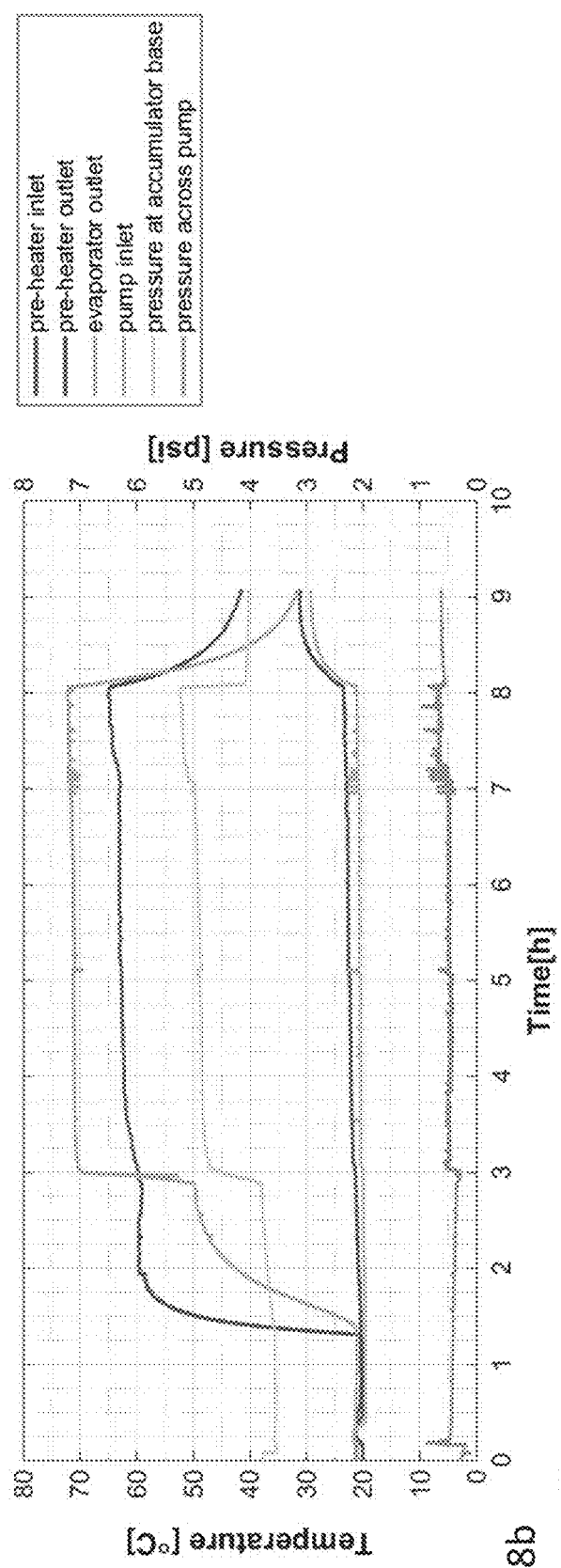
FIGS. 18a and 18b provide plots of experimental data for the MFA system set to produce an isothermal evaporator with heat loads ranging from 200 W to 390 W according to embodiments.
Figure 18B:
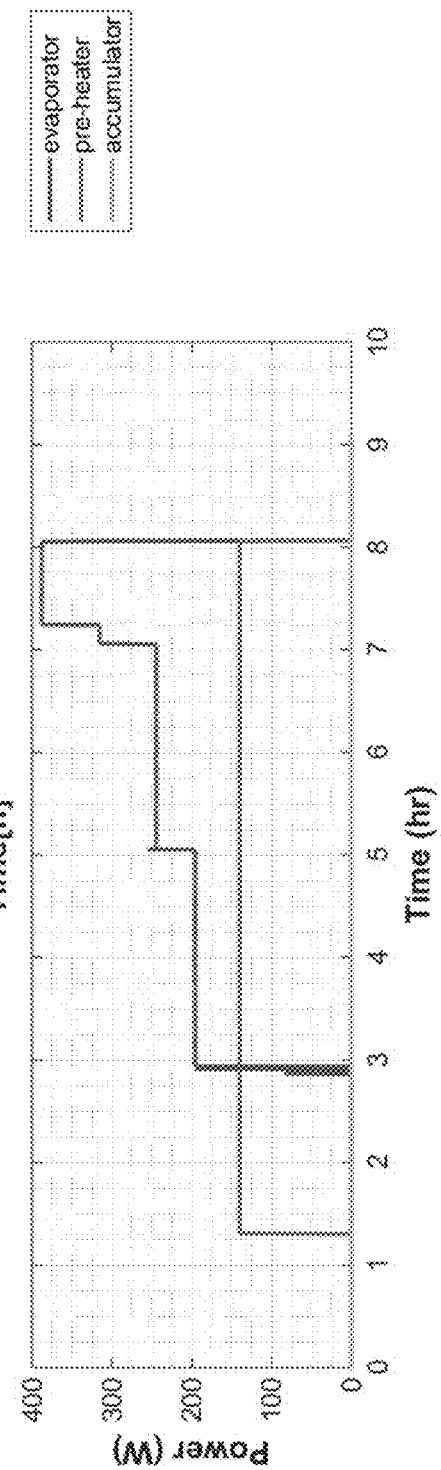

FIGS. 18a and 18b show select temperatures and pressures in the loop over the course of the experiment, as well as the heat loads applied to the evaporator. The pump was turned on at about 0.25 hr. At 1.25 hr, 140 W were applied to the pre-heater. At 2.9 hr, the evaporator heater was powered to 200 W. The evaporator heat load was subsequently increased to 250 W (5 hr), 315 W (7.1 hr) and then 390 W (7.25 hr).

Over the course of the experiment, the accumulator pressure increased both gradually and suddenly. The pressure increases are mostly due to the volume of air in the accumulator being compressed as the fluid in the loop expands. The primary fluid expansions occur when the pre-heater is turned on (1.3 hr), when the initial heat load is applied to the evaporator (2.9 hr), and when the final heat load is applied to the evaporator (7.25 hr). The evaporator heat load produces vapor, which leads to a significant increase in working fluid volume. Superimposed on these relatively sudden pressure changes is a more gradual increase in pressure. This is due to the temperature of the gas in the accumulator gradually rising over the course of the test. This was due to the ambient room temperature gradually increasing. The ambient temperature rise is also reflected by the gradual increase in the fluid temperature at the outlet of the condenser/subcooler. These pressure increases are attended by an increase in saturation temperature. This explains the slight increase in the evaporator temperature over the course of the test. For the majority of the test the fluid at the evaporator inlet was approximately 9° C. subcooled.

The pressure drop remained fairly constant over the course of the test with a slight decrease when the pre-heater was activated and an increase when the evaporator heat load was increased. The initial decrease near 2 hr was due to a reduction in fluid viscosity as the fluid warmed. The subsequent increases in ΔP were due to the two-phase pressure drop when the evaporator heater was activated or changed.

Figure 19:
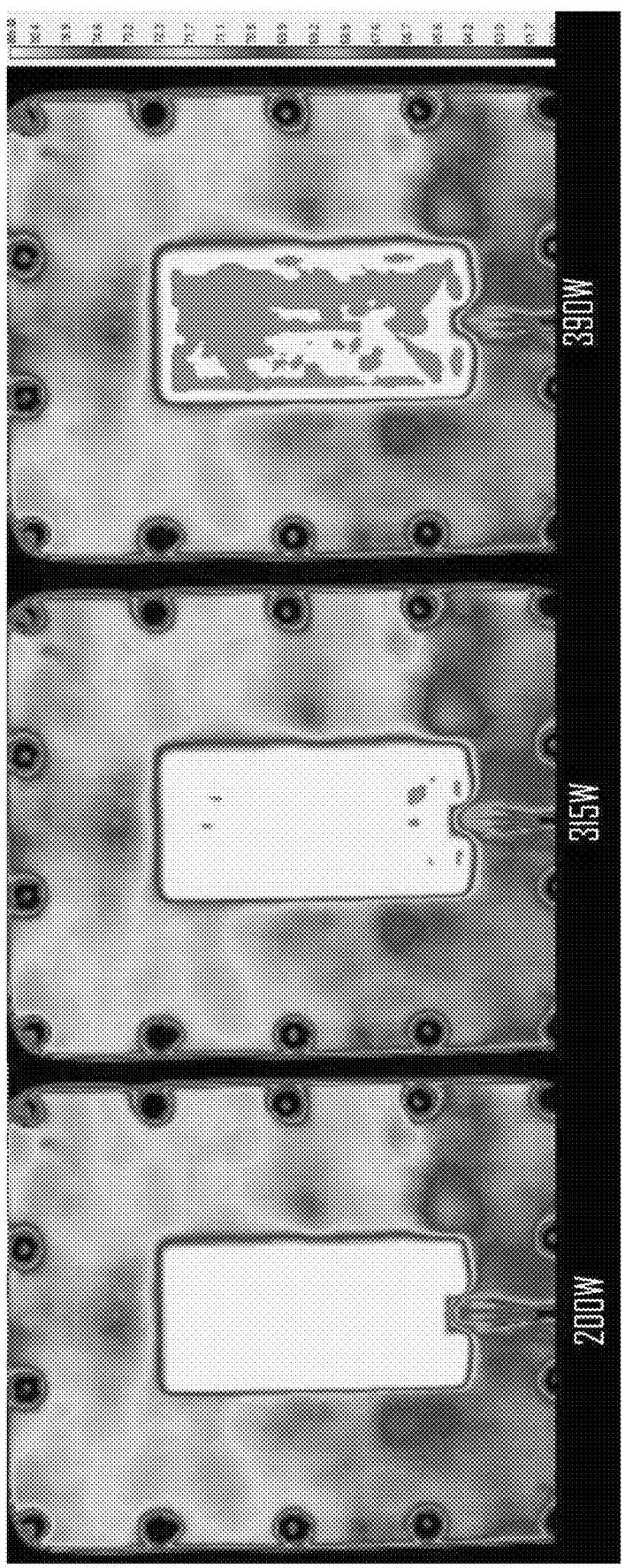
FIG. 19 provides IR images of the MFA evaporator with three different heat loads: 200 W, 315 W, and 390 W according to embodiments.

The most noteworthy characteristic of the data is that the fluid temperature at the outlet of the evaporator does not significantly change as the heater power is nearly doubled. This is one of the well-touted attributes of mechanically pumped two-phase systems. IR images of the evaporator illustrate this phenomenon even more clearly. FIG. 19 shows IR images of the evaporator with three different heat loads. In each case the evaporator is effectively the same temperature. These images also highlight the high degree of isothermality attained on the evaporator. The entire surface is within a temperature band of 3° C., although it should be noted that the evaporator is aluminum (highly conductive) and about ¼ of the target evaporator size. A single phase system using the same working fluid and flow rate would have a temperature difference of 111 C across a heat load of 390 W (using: $Q=mc_p\Delta T$).

Subcooling Study:

One of the concerns with an MFA system is that some form of pre-heater must be used to bring the working fluid up near the saturation temperature. This is done to: (1) ensure two-phase heat transfer in the evaporator and (2) to keep the temperature difference across the evaporator as low as possible. Ideally, the entire evaporator is at the saturated temperature, which varies little over its length. The isothermal capability of the evaporator described above was experimentally investigated by applying several different heat loads and degrees of subcooling. As would be expected, the degree of isothermality is a strong function of the heat load and degree of subcooling.

In the test case described above (steady state isothermal evaporator), a fairly isothermal evaporator was obtained with a heat load varying from 200 W to 390 W and the inlet fluid being subcooled by 9° C. The heater was centered on the evaporator in this case and covered approximately 17% of the heat acquisition surface. A more challenging case is to achieve isothermality when there is a high degree of subcooling, or a small heater is used with a low heat load. This is the case that is discussed below.

In an ideal evaporator, any heat load would produce a layer of vapor, which would fill the evaporator's vapor cavity. This would force the entire heat acquisition surface to be near the saturation temperature. This was the goal with embodiments of the MFA evaporator. In this experiment, however, several issues were identified that inform optimal evaporator design.

First, in this exemplary embodiment the casing was made from a material with a high thermal conductivity (aluminum). The high conductivity makes it hard to decouple the evaporator liquid temperature from the heat acquisition surface, which results in the unwanted cooling of that surface. Accordingly, in embodiments a casing material that has a lower thermal conductivity may be used. The other oversight is more fundamental and related to fluid dynamics. The issue arises from the fact that the liquid and vapor chambers are not completely separated. The liquid can flow into the vapor side either through the wick (if there is no liquid vapor interface in the wick to inhibit flow) or through the connecting channel. This was observed to occur during testing and inhibited the ability to maintain an acceptable degree of isothermality when subcooled liquid was present. An additional issue came from the vapor produced by the heat load evidently getting superheated.

Figure 20:
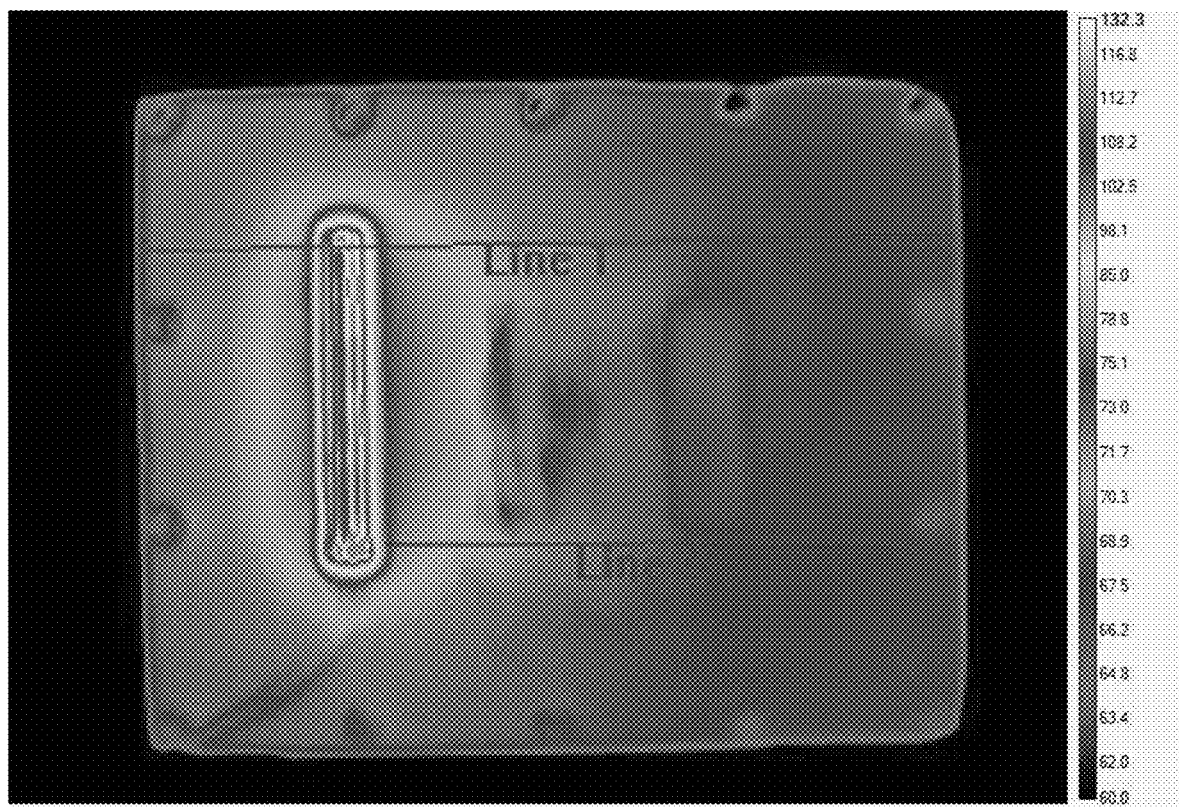
FIG. 20 provides an IR image of the evaporator with a small heater used to study the effect of subcooling on the isothermality of the evaporator.

A series of tests was conducted where a 2.4 cm×10 cm heater mounted near the evaporator inlet was used to supply 48 W of heat. The heater covered approximately 10% of the heat acquisition surface. The isothermality of the surface was measured as a function of different levels of subcooling at the evaporator inlet. The degree of subcooling was varied from 10 to 0.5° C. The isothermality of the evaporator was measured using the temperature difference between a point right next to the heater and a point close to the edge of the vapor cavity by the evaporator outlet. Temperatures were measured using an IR camera. FIG. 20 shows an IR image of the evaporator with the line along which temperature was measured. While the temperature gradient decreased as the level of subcooling decreased, it remained appreciable. Even with only 0.5° C. of subcooling, the $\Delta T$ across the evaporator was found to be 6° C. In the case where the subcooling was 10° C., the $\Delta T$ across the evaporator was also 10° C. The temperature gradient was due to two components: (1) The $\Delta T$ between the sub-cooled liquid and saturated vapor, and (2) superheating of the vapor near the heater. The latter reason caused the $\Delta T$ across the evaporator to be even larger than the degree of subcooling, when the subcooling was relatively small.

Accumulator Position:

In mechanically pumped two-phase fluid loops, the accumulator is often located near the inlet of the pump, to ensure sufficient NPSH. However, in principle, locating the accumulator this far from the evaporator could be seen to be sub-optimal for a system that requires high temporal stability in the evaporator. After all, the operating temperature in the evaporator is ultimately dictated by its saturation temperature, which is in turn controlled by the local pressure. The accumulator provides the control point for the pressure in the loop. Accordingly, in embodiments the accumulator is disposed closer to the evaporator, such that it can be used to more directly regulate the evaporator pressure and thus enhance its temperature stability.

As such, MFA system testing was done with the accumulator in two different positions: (1) near the evaporator inlet or (2) near the pump inlet. It was found that locating the accumulator near the inlet of the evaporator led to flow instabilities in the form of periodic oscillations in the fluid flow. It was found that these oscillations could be suppressed by increasing the flow resistance between the inlet of the evaporator and the accumulator. This somewhat negated the benefit of situating the accumulator near the evaporator, since the additional resistance inherently creates a separation in pressure between the accumulator and evaporator. Additional details are given below.

When the accumulator was located at the inlet of the evaporator, a flow instability arose soon after a heat load was applied to the evaporator. The flow instability manifested as a periodic oscillation where the system alternated between two different states. In the primary state operation was normal and the fluid flowed in the expected manner; in the secondary state the fluid would flow backwards in the section of the loop between the accumulator and evaporator. That is, the fluid would flow from the evaporator to the accumulator. This was clearly observed in the experiment as vapor could be seen entering the accumulator via a sight glass.

Figure 21:
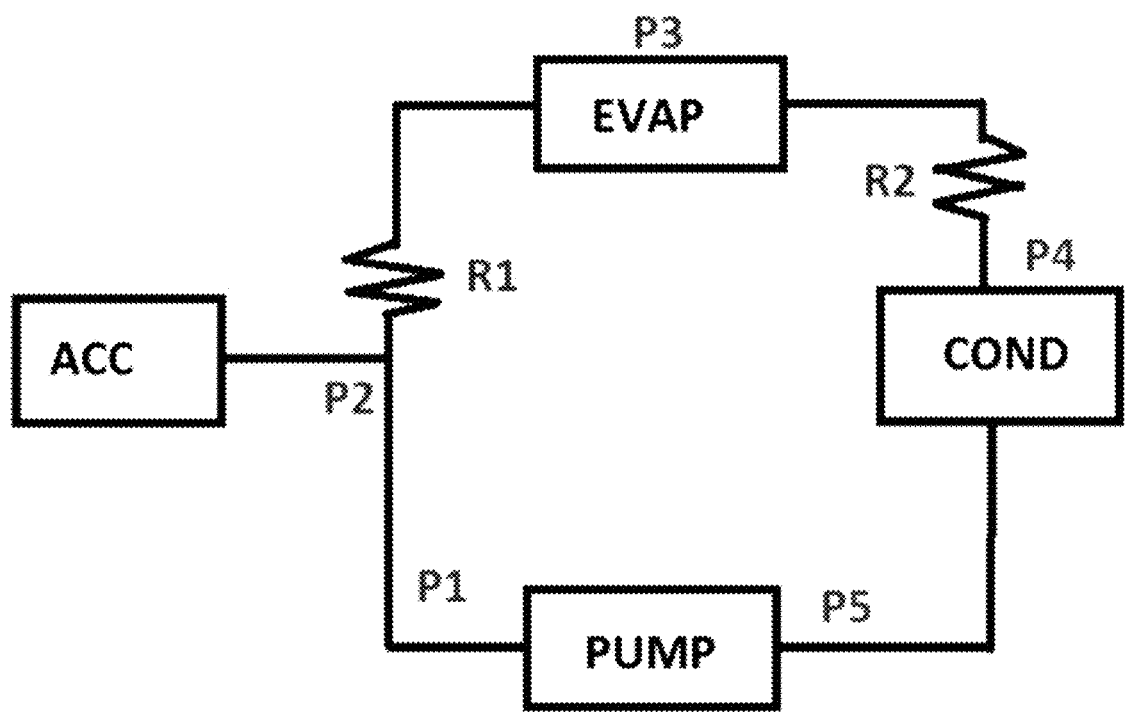
FIG. 21 provides a schematic of the MFA system pressures and flow resistances according to embodiments.

This phenomenon can be explained using a simple flow resistance model. FIG. 21 shows a schematic of the MFA system with the flow resistances. During normal operation the pressure monotonically decreases from the pump outlet to the pump inlet (P1>P2>P3>P4>P5). However, the instability sets in when the two-phase pressure flow resistance (R2) starts to grow as the flow is established. The growing two-phase flow restriction causes the pressure in the evaporator to build as additional vapor is continually produced by the heat load. At some point, the pressure in the evaporator (P3) becomes larger than the pressure in the accumulator (P2), and it becomes easier for the fluid to flow to the accumulator. Analytically, this corresponds to the case when (P3−P2)/R1>(P3−P4)/R2. During the period of backflow, the pumped fluid is redirected into the accumulator. This backflow condition can be suppressed by increasing the resistance between the accumulator and the evaporator (R1) such that (P3−P2)/R1<(P3−P4)/R2 always.

Evaporator Orientation:

The exemplary evaporator designed for this testbed incorporates a wick element to mitigate the effects of gravity. One of the primary functions of the wick is to ensure that the heated surface stays wetted, regardless of orientation. Dry out of the heated surface is a known issue, especially if the heated surface is facing upwards. Testing was done in order to verify that the wick was functioning as anticipated and was able to keep the heated surface wetted, without vapor penetration. To do this, the evaporator was operated both with the heated surface facing downwards and with the heated surface facing upwards. Results indicated that the wick element functioned as anticipated. Dry out was never encountered with the heated surface facing upwards and heat fluxes up to 2.5 W/cm$^2$. Additionally, the heated surface was kept within 3° C. of the fluid saturation temperature when the heated surface was facing downwards, with subcooled liquid entering the evaporator (see FIG. 20). The heat load was at least 200 W and level of subcooling was 9° C. This suggests that the wick provided effective phase separation when the heat load was high enough.

Example 3: Separated Flow Architecture Tests

In other embodiments, an SFA architecture was explored. FIG. 9 (left) shows the key elements of the architecture. A pump circulates the working fluid, an evaporator absorbs the heat load, and a condenser rejects the heat load. An accumulator is used to set the system pressure at the pump inlet. The evaporator is designed similarly to a CPL evaporator, with liquid and vapor channels being separated by a porous wick (FIG. 10a). Unlike a CPL evaporator, the SFA evaporator has a liquid outlet line that allows the liquid flow to bypass the evaporator and continually circulate during normal operation. This means that during normal operation, excess liquid is not forced through the wick by the pump. Instead, the wick picks up whatever liquid it needs to satisfy the vapor mass flow rate required by the heat load. The vapor and liquid phases remain separated in the entire loop except for in the condenser.

Figure 22:
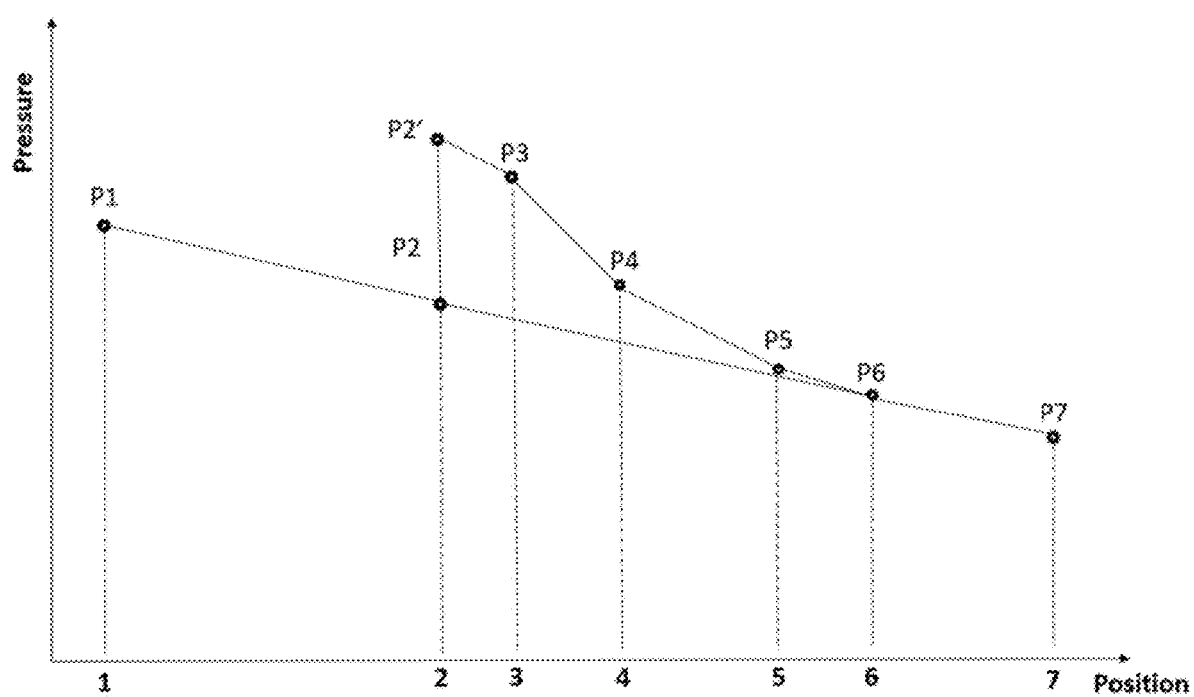
FIG. 22 provides a data plot of pressure vs. position for an SFA system according to embodiments.

To better understand the architecture, it is useful to consider how pressure varies through the system at steady state. FIG. 22 schematically shows the pressure in the system as a function of position. These positions correspond to the locations labeled in FIG. 9. At the outlet of the pump (1), the pressure is high. Between the pump outlet and evaporator inlet the flow is single phase liquid and pressure decreases monotonically. Inside the evaporator, two distinct pressure regions exist: one in the vapor chamber (2') and one in the liquid chamber (2). These chambers are completely separated by a porous wick that contains the liquid-vapor interface during steady state operation. The application of a heat load maintains the presence of vapor in the vapor chamber. The liquid-vapor interface forms a meniscus that can sustain a pressure difference across it. During normal operation, the pressure in the vapor chamber is higher than in the liquid chamber. This prevents liquid from being forced into the vapor chamber by the pump. Depending on how the system is designed, the vapor pressure in the vapor chamber can be even higher than at the pump outlet. The pressure in the liquid chamber varies relatively little between the inlet and outlet of the evaporator, since the hydraulic diameter here would typically be bigger than in the transport lines. In the liquid bypass line between the evaporator (2) and the point where the liquid and vapor lines meet (5), the pressure drops monotonically due to the flow of liquid. In the vapor line between the outlet of the evaporator (2') and the point where the two flows meet (3), the pressure also monotonically decreases. In the first leg of the line between the evaporator (2') and condenser (3), the flow is pure vapor; in the second section within the condenser (3 to 4) the flow is two-phase; and in the third section from the condenser outlet (4) to the point where liquid and vapor lines recombine (5) the flow is pure liquid. After the two lines meet the flow is liquid up to the pump inlet (6). The pressure at the pump inlet is fixed by the accumulator.

Basic Model

Figure 23:
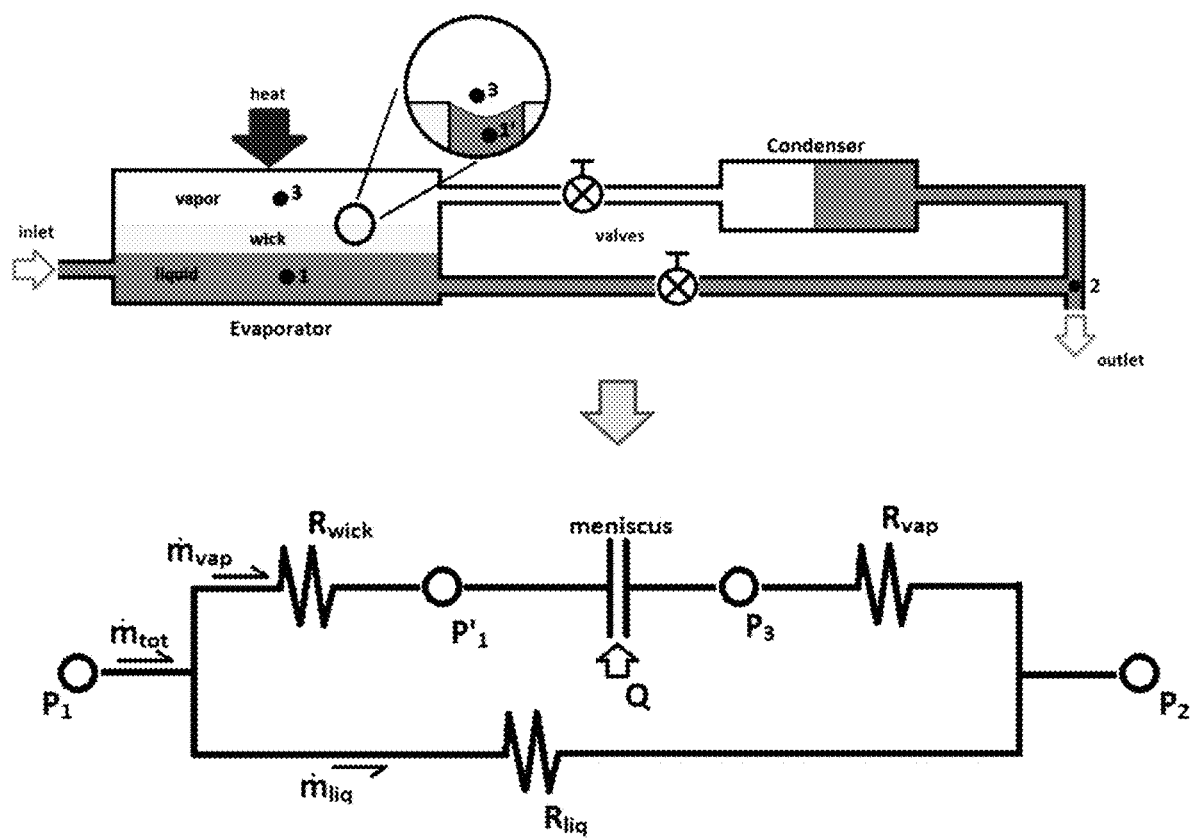
FIG. 23 provides a schematic of the section of the SFA system that is being modelled (above), and the corresponding circuit diagram (below) according to embodiments.

In this section a basic lumped parameter model is developed and used to better understand how an SFA system operates in accordance with embodiments and what some of its limitations are. Consider the portion of a simple SFA system from the evaporator inlet to the point after the condenser where the liquid and condensed vapor lines meet (point 6 in FIG. 9). This is the section of an SFA system that is of primary interest. FIG. 23 shows two schematics of this section illustrating the physical system and its simplified, abstracted circuit diagram. At steady state, the vapor chamber is filled with vapor as is the line between the outlet of the evaporator and the condenser. The condenser contains two-phase flow, and the remainder of the system contains liquid. The liquid and vapor phases are separated in the evaporator by a meniscus, which forms in the wick (just as in a heat pipe). The key physical parameters accounted for in the lumped parameter model are shown on the circuit diagram. Pressure in the liquid chamber and on either side of the meniscus is captured as well as flow resistances in the wick ($R_{wick}$), liquid chamber ($R_{liq}$) and vapor chamber ($R_{vap}$). Note that and also include the hydraulic resistances of the liquid and vapor lines at the outlet of the evaporator up to the point where the two lines meet (point 2 in FIG. 23).

At steady state operation the system can be described with the following equations:

$P_0$—pressure $Q = \overline{m}_{vap} \lambda$ (EQ. 12)

$\overline{m}_0$—mass flow rate $\overline{m}_{tot} = \overline{m}_{vap} + \overline{m}_{liq}$ (EQ. 13)

$Q$—heat load on evap $P_1 - P_2 = \overline{m}_{liq} R_{liq}$ (EQ. 14)

$R_0$—flow resistance $P_3 - P_2 = \overline{m}_{vap} R_{vap}$ (EQ. 15)

$\lambda$—latent heat of vap. $P_1 - P'_1 = \overline{m}_{vap} R_{wick}$ (EQ. 16)

The variables are defined next to the equations and are shown in FIG. 23. EQ. 12 relates the heat applied to the evaporator to the rate of vapor formation. Implicitly, this equation only accounts for the heat that goes into the vapor—heat that goes into bringing the subcooled liquid up to saturation and heat losses are not included. EQ. 13 states the conservation of mass for the system. EQ. 14 describes the relationship between pressure drop and flow rate through the liquid chamber of the evaporator and the entire liquid line up to the point where it recombines with the condensed vapor line. EQ. 15 describes the pressure drop/flow relationship from the vapor side of the meniscus through the condenser up to where the two flow lines meet. EQ. 16 describes the hydraulic flow through the wick from the liquid chamber up to the liquid side of the meniscus. Depending on the flow regime, the flow resistance may be a function of the flow rate. The pressure drop between the inlet of the evaporator and the liquid side of the wick are considered negligible. The model is a lumped-parameter model that assumes the steady-state operation described above.

To apply the model, the dependent and independent variables must be defined. For an actual system, it would be expected that the total flow rate ($m_{tot}$) is known and controlled. With this information and knowledge of the system, the pressure at the inlet of the evaporator ($P_1$) is easily found.

Similarly the hydraulic resistances of the system would be dictated by the physical geometry and the heat load (Q) would be known. The latent heat of vaporization (λ) would be fixed by the selection of a working fluid. This implies that the independent variables of the model are: $m_{tot}$, λ, Q, $R_{liq}$, $R_{vap}$, and $R_{wick}$. The dependent variables are then $m_{vap}$, $m_{liq}$, $P_2$, $P_3$, and $P'_1$. With these stipulations, EQs. 12 to 16 form a system of 5 equations with 5 unknowns. The problem is therefore well posed and has a unique solution.

The model given by EQs. 12 to 16 can be used to explore how changes in the independent variables (e.g. $m_{tot}$) affects system performance. Of particular interest is to see how an SFA system compares to a CPL or LHP type system. The fact that the system relies on the capillary head of the wick for operation begs the question of whether this architecture offers any advantage to a CPL or LHP. In a CPL and LHP, the evaporator functions as the pump, and pressure increases across the meniscus from the liquid to the vapor side. This pressure rise adjusts so that it is equal to the pressure drop in the remainder of the system. One of the classical limits of a CPL/LHP is that the pressure drop in the system must be less than the capillary head available in the capillary pum3. For a capillary pump, the maximum available head is equal to: $2\sigma/r_{eff}$. This cap on the max allowable pressure drop ultimately limits the allowable heat load, since increasing the heat load increases the mass flow rate, which increases the pressure drop. Using the model developed above (EQs. 12 to 16), the pressure difference across the meniscus $(P_3-P'_1)$ can be solved for in terms of the independent (known) quantities. Doing this yields:

$$(P_3 - P'_1) = \frac{Q}{\lambda}(R_{vap} + R_{liq} + R_{wick}) - \dot{m}_{tot}R_{liq} \qquad \text{(EQ. 17)}$$

Note that unlike an LHP, the pressure across the meniscus is not simply equal to the pressure drop across the system—it is a more complex function of flow resistances, the pumped flow rate and heat load. EQ. 17 suggests that even the pressure drop across the vapor line is not solely reliant on the capillary head developed across the meniscus. This can be more clearly seen by substituting EQ. 12 into EQ. 17 and solving for the pressure drop in the vapor line $(P_3-P_2)$:

$$(P_3 - P_2) = (P_3 - P'_1) + \dot{m}_{tot}R_{liq} - \frac{Q}{\lambda}(R_{vap} + R_{wick}) \qquad \text{(EQ. 18)}$$

For a given heat load (Q), the vapor mass flow rate is fixed as is the pressure drop across the vapor line $(m_{vap})$. The pressure head developed to overcome this pressure drop comes from the meniscus $(P_3-P'_1)$ and the pump $(m_{tot}R_{liq})$. The burden on the meniscus can be reduced by increasing the mass flow rate put out by the mechanical pump $(m_{tot})$, or by increasing the resistance in the liquid line $(R_{liq})$. This second effect can be more clearly seen by substituting EQs. 12 and 13 into 18 and rearranging:

$$(P_3-P_2)=(P_3-P'_1)+\overline{m}_{liq}R_{liq}-\overline{m}_{vap}R_{wick} \qquad \text{(EQ. 19)}$$

While an SFA system is not as reliant on the capillary pumping head as an LHP, it still has limits of operation that stem from the capillary wick in the evaporator. For normal SFA operation, the vapor and liquid in the evaporator must remain separated by the meniscus in the wick. This means that liquid cannot flow into the vapor chamber, and similarly vapor cannot flow into the liquid chamber. In order for liquid to be prevented from flowing into the vapor chamber, the pressure must be higher in the vapor chamber than in the liquid chamber. However, in order to ensure that vapor does not penetrate the wick and enter the liquid chamber, the pressure across the meniscus cannot exceed the available capillary pressure head: $2\sigma/r_{eff}$. If the available capillary pressure is exceeded, vapor will push back the meniscus and flow into the liquid chamber. These requirements on pressure can be formalized as:

$$0 < (P_3 - P'_1) < \frac{2\sigma}{r} \qquad \text{(EQ. 20)}$$

This equation states that the pressure difference across the meniscus must be less than the maximum available capillary head and greater than zero. Substituting EQ. 17 into EQ. 20 and rearranging yields limitations on the allowable heat load (Q) for a given system:

$$\frac{\lambda(\dot{m}_{tot}R_{liq})}{(R_{vap} + R_{liq} + R_{wick})} < Q < \frac{\lambda\left(\frac{2\sigma}{r} + \dot{m}_{tot}R_{liq}\right)}{(R_{vap} + R_{liq} + R_{wick})} \qquad \text{(EQ. 21)}$$

If the heat load is less than the minimum allowable value given by the left hand side of EQ. 21, liquid will enter into the vapor chamber; if the heat load is greater than the maximum allowable value given by the right hand side of EQ. 21, vapor will enter the liquid chamber. As alluded to previously the maximum allowable heat load is not solely limited by the available capillary head of the wick $2\sigma/r_{eff}$ as in an LHP. Instead, it is also a function of the hydraulic resistances in the system, the latent heat of the working fluid, and the mass flow rate produced by the pump. The max allowable heat load can be increased in a few different ways: by decreasing hydraulic resistances in the system or by increasing the mass flow rate put out by the pump. This gives the SFA a system level advantage over an LHP or CPL: the max allowable heat load is not solely dictated by the capillary wick.

With some clear limitations on system performance defined by the model, it is natural to ask how a real system might be limited. To do this, the maximum and minimum allowable heat loads were calculated for a specific set of system parameters (line length, fluid properties, flow rate). The system was assumed to have a liquid line of 5 m (from the evaporator liquid outlet to the point where the liquid and vapor line recombined); the vapor line was assumed to be 15 m (from the evaporator vapor outlet through the condenser up to the point where the liquid and vapor lines meet). The internal diameter of all lines was assumed to be 9.52 mm (0.375 in). The effective pore size of the wick was assumed to be 60 um and the permeability was assumed to be $4\times10^{-11}$ m². Fluids were assumed to be perfectly wetting. Hydraulic resistances were calculated using either a laminar or a turbulent model as appropriate. The flow rate was held constant at 200 mL/min. Fluid property data was taken from NIST reference values assuming an operating temperature of 20° C. The results for 26 different fluids are shown in Table 2.

TABLE 2

| Fluid | $Q_{min}$ (W) | $Q_{max}$ (W) |
| --- | --- | --- |
| Ammonia | 217.6 | 1559.2 |
| Butane | 103.4 | 438 |
| 1-Butene | 101.4 | 450.2 |
| Deimethylether | 109.5 | 568.5 |
| Hydrogen sulfide | 155.2 | 861.1 |
| Isobutane | 111.8 | 416.2 |
| Isobutene | 102.6 | 449.2 |
| Propane | 141.8 | 492.1 |
| Propylene | 147.8 | 525.5 |
| Propyne | 126.5 | 587.7 |
| R115 | 67.8 | 278.2 |
| R12 | 70.1 | 383.1 |
| R1234 | 74.8 | 344.1 |
| R1234ZE | 80.1 | 411 |
| R124 | 125.5 | 542.6 |
| R134A | 86.7 | 427.1 |
| R142 | 104.4 | 507.6 |
| R143 | 90.4 | 351.8 |
| R152A | 99.2 | 492.2 |
| R161 | 116.2 | 565.1 |
| R218 | 65.1 | 245.8 |
| R22 | 85.5 | 460.5 |
| R227EA | 95.1 | 402.5 |
| R32 | 104.5 | 518.4 |
| Sulfur dioxide | 136.5 | 953.5 |
| Water | 9.2 | 65.3 |

Of course other practical limitations may constrain an SFA system more than the constraints defined in EQ. 21, however these constraints give an initial filter to see how a real SFA system using different fluids might be limited. In Table 1, several fluids look promising from an allowable heat load perspective including some common refrigerants and heat pipe fluids such as ammonia and propylene. Surprisingly water does not offer very good performance. This is because the latent heat is not the only property that matters—other properties that enter into the hydraulic resistance are important as well (liquid and vapor viscosity and density).

Separated Flow Testbed

Figure 24:
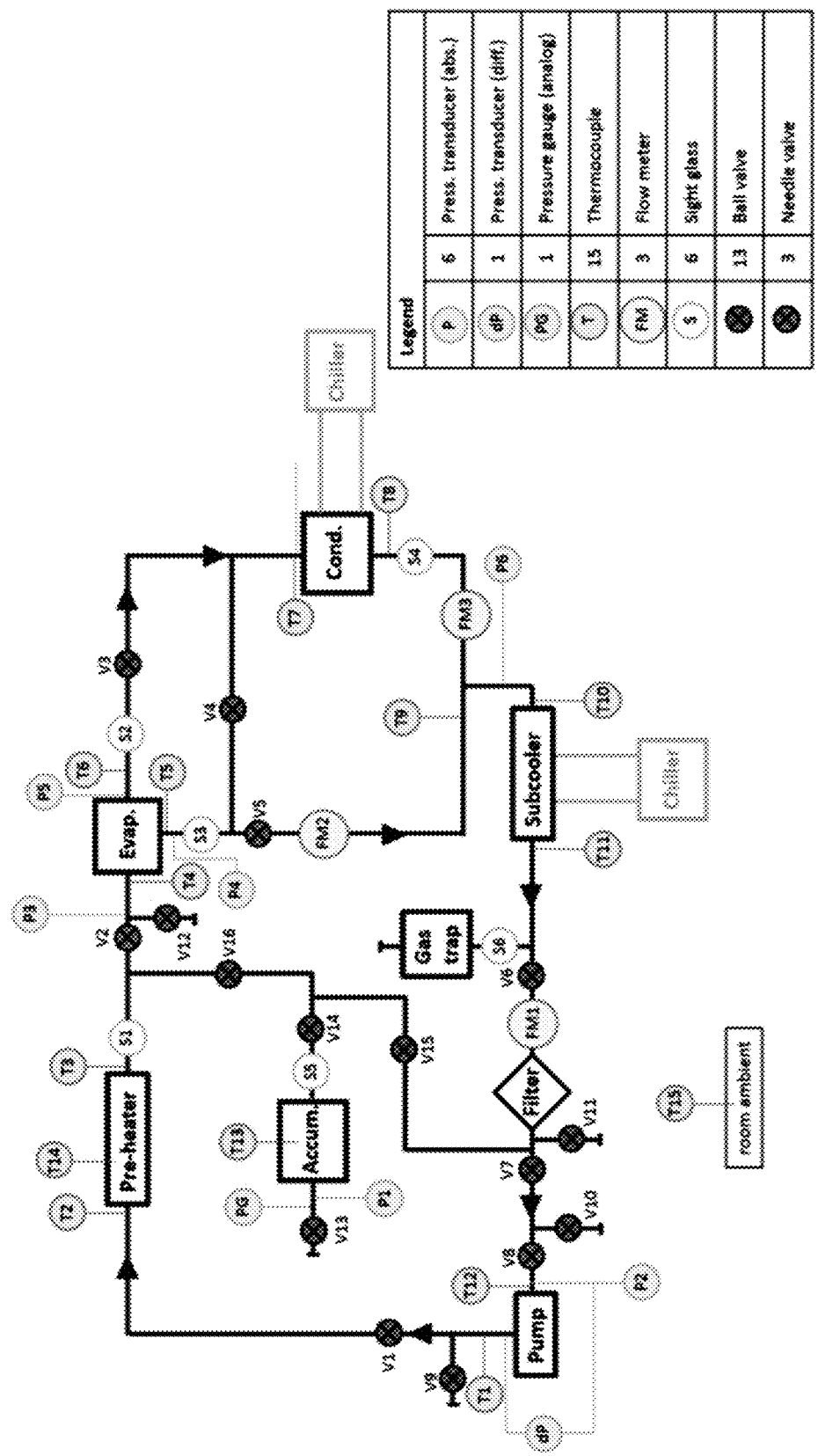
FIG. 24 provides a schematic of an SFA testbed according to embodiments.

A testbed was designed and developed and built to experimentally explore embodiments of a SFA thermal control system incorporating embodiments of the evaporator. A schematic of the SFA testbed is shown in FIG. 24. A centrifugal pump circulates the working fluid sequentially through a pre-heater, evaporator, condenser, and subcooler. The flow is split into two parallel paths in the evaporator where the heat load is applied. One path is used for vapor transport and the other for transporting liquid, which bypasses the evaporator. After the vapor flow is condensed in the condenser, the two streams reunite to pass through the subcooler. Other components include a gas trap to capture non-condensable gases, a filter to protect the pump, and an accumulator to control system pressure. The plumbing for the accumulator was setup so that the accumulator position could be changed between the evaporator inlet and the pump inlet. Multiple needle and ball valves were incorporated to facilitate maintenance operations and vary operational conditions. The system was instrumented to read fluid temperatures, pressures and flow rates in multiple locations around the loop. Water was used as the working fluid for convenience.

Most of the components used were commercial off-the-shelf parts. A miniature centrifugal style pump was used to circulate the fluid. A high efficiency cold plate mounted with heaters was used as the pre-heater. Brazed plate heat exchangers were used as the condenser and subcooler. A custom accumulator was built to enable temperature control for saturated fluid pressure regulation. The accumulator was essentially a shell and tube heat exchanger, where the shell side was attached to the SFA system and the tube side circulated fluid from a temperature controlled chiller. This enabled the temperature control of the accumulator, which also dictated pressure for this saturated system. The system was insulated to thermally isolate it from the environment. The evaporator described above in accordance with embodiments was used in the testbed.

SFA Test

A set of tests were carried out utilizing the testbed described above. Operational parameters were varied such as: flow rate, evaporator heat load, degree of pre-heating, and the method of pressure control in the accumulator. The general goal of the testing was to develop an understanding of how the system behaves utilizing an evaporator in accordance with exemplary embodiments. Additionally, the system stability was investigated by perturbing the system and observing whether it could regain stable operation. The condenser temperature and heat loads were varied along with the pump operation. Over the course of testing the following points were demonstrated:

A stable separated flow system is possible;
A pre-heater is not required for an SFA system; and
The SFA system is stable and robust;
  Evaporator performance was insensitive to fluctuations in condenser temperature of 10° C. (0.8° C./min rate), and
  The system could recover from excessive/insufficient heat loads, the pump stopping, and the condenser stopping to function for temporary periods.

Nominal Operation:

Stable system operation with the exemplary SFA testbed was demonstrated for two different flow rates and a range of heat loads. It was found that the pre-heater was not needed. During stable operation, separated flow was established in the system with vapor filling the vapor line and liquid filling the liquid line. Stable, separated flow was only achievable for a range of heat loads. If the heat load was too low, liquid was seen in the vapor line; if the heat load was too high, vapor was seen in the liquid line. Additionally, it was found that higher flow rates could accommodate higher heat loads. This is also consistent with the theory presented above. Table 3 shows the range of allowable heat loads established for two different flow rates for the SFA testbed using water as the working fluid.

TABLE 3

| Flowrate (mL/min) | Range of heat loads (W) |
| --- | --- |
| 50 | 225-250 |
| 79 | 275-350 |

Figure 25:
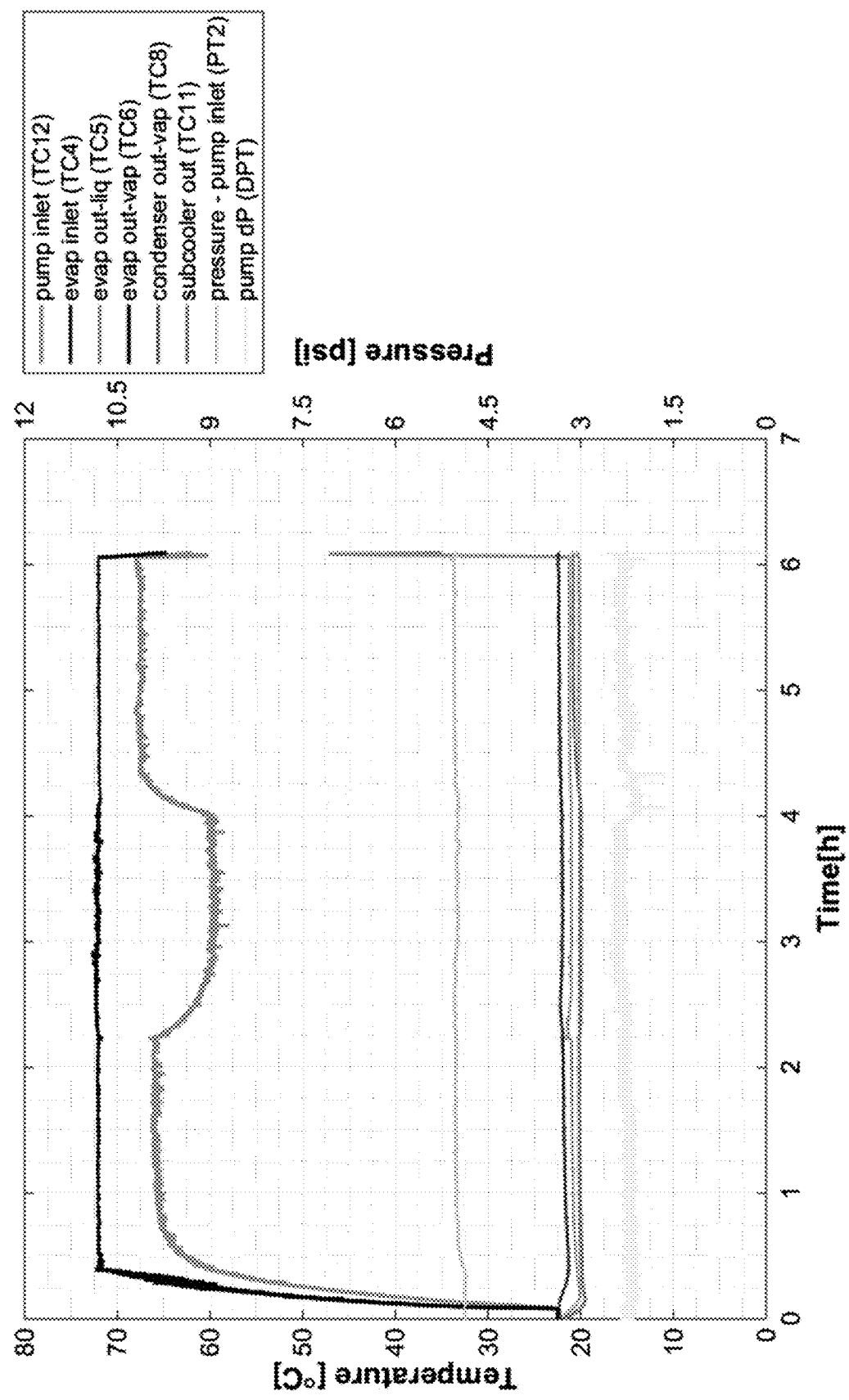
FIG. 25 provides plots of experimental data for the SFA system according to embodiments.

FIG. 25 shows test data from the SFA testbed at stable operation. The flow rate was 79 mL/min and no pre-heater was used. System pressure was held at 5 psia at the pump inlet using a temperature controlled, saturated accumulator. The evaporator saturation temperature was 68° C.; the subcooler was set to output fluid at 21° C. The evaporator heat load was set to 350 W for the entire test except from 2.25 hr to 4 hr, when the heat load was 275 W. The flow remained separated over the course of the test. This was verified by observing sight glasses placed at the evaporator outlets, and was corroborated by the fact that the evaporator liquid outlet temperature was subcooled, while the vapor outlet temperature was saturated.

Promising features of this data are: (1) The temperature at the evaporator outlet does not significantly change with heat load, as expected; (2) the flow remains separated with the liquid at the liquid outlet of the evaporator remaining subcooled and the vapor at the vapor outlet remaining saturated; (3) No pre-heat is needed for stable operation, even with the fluid entering the evaporator 50° C. subcooled. These features demonstrate the stable operation of the SFA testbed, and its potential to provide performance without a pre-heater.

Other features of the data are: (1) the liquid on the liquid side of the evaporator increases in temperature by about 45° C. from the inlet to the outlet, and (2) the outlet vapor temperature becomes a little more noisy when the lower heat load is applied (275 W). The increase in temperature of the liquid flow in the evaporator indicates significant heat transfer to the liquid and that the liquid and vapor sides are thermally well-coupled. Using $Q=(mc_p\Delta T)$, the heat loss during this experiment was estimated to be 173 W or 49% of the applied heat load. This strong thermal connection between the liquid and vapor sides inhibits the performance of the evaporator in two ways. Firstly, it prevents the evaporator from reaching any reasonable degree of isothermality for small heat loads, if the fluid is entering highly subcooled. In this case, the temperature of the cold liquid cools the top surface of the evaporator near the liquid inlet and the temperature gradient across the heat acquisition surface becomes untenable. In the same vein, the heat that is lost to the liquid side would otherwise be used to produce more vapor, which would make it more likely to fill the vapor cavity with vapor. Filling the vapor cavity with vapor is a pre-requisite for an isothermal evaporator. Secondly, when the heat transfer path to the liquid is too large, boiling can occur in the liquid side of the evaporator. This can prematurely limit the maximum allowable heat load that would otherwise be possible. For these reasons decoupling the liquid and vapor regions is crucial for good performance of the evaporator.

System Stability:

The stability of the SFA testbed was investigated by establishing a stable operating condition (with stable separated flow), and perturbing it. Methods of perturbing included: stopping the pump, varying the condenser temperature, exceeding the max allowable evaporator heat load, or applying a heat load below the minimum allowable heat load for stable operation. In all these cases, the system was able to consistently recover once the nominal operating conditions were restored.

Figure 26:
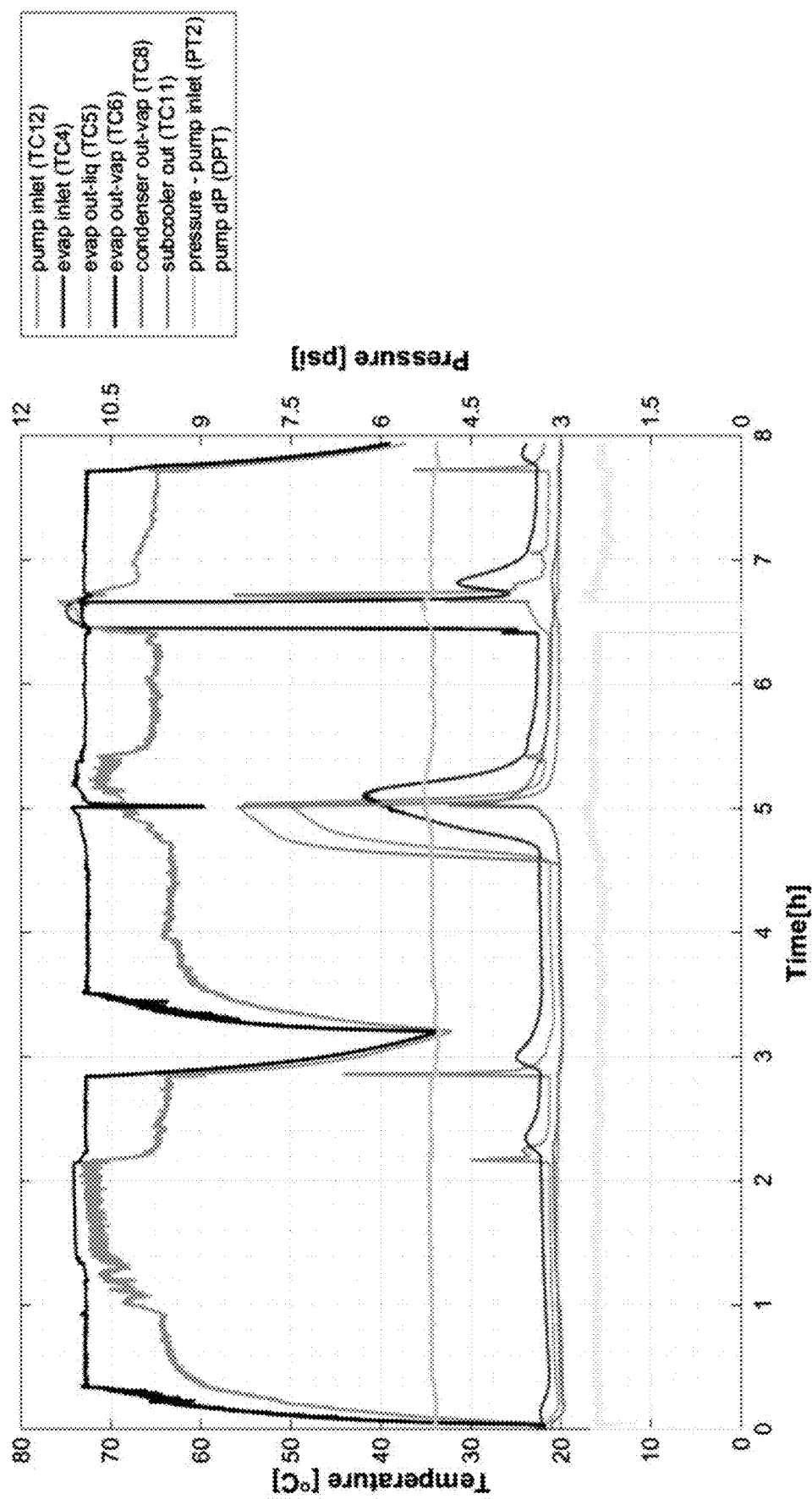
FIG. 26 provides data plots of the SFA system undergoing stability testing according to embodiments.

FIG. 26 shows test data incorporating four different perturbations. Steady separated flow was initially established in the testbed with a flow rate of 79 mL/min and an evaporator heat load of 350 W. The accumulator was located at the pump inlet. After stable operation was established (0.8 hr), the perturbation sequence was initiated. This consisted of forcing a known operating condition that resulted in the loss of steady separated flow and then restoring the initial nominal operating conditions. In each case, the testbed reverted to its initial stable state once the nominal operating conditions were restored. At 1 hr the evaporator heat load was increased to 450 W—this resulted in the loss of separated flow with vapor exiting the liquid outlet of the evaporator. At 2.8 hr, the evaporator heat load was shutoff—this resulted in liquid exiting the vapor outlet of the evaporator. At 4.7 hr, the condenser chiller was turned off—this eventually resulted in vapor exiting at the liquid outlet of the evaporator. At 6.4 hr, the pump was turned off—this resulted in vapor being pushed out of all ports of the evaporator and the evaporator wick drying out. In between each of these perturbation events, the system was restored to a stable steady operating point by restoring the initial conditions. No hysteresis effects or flow instabilities were observed.

Figure 27:
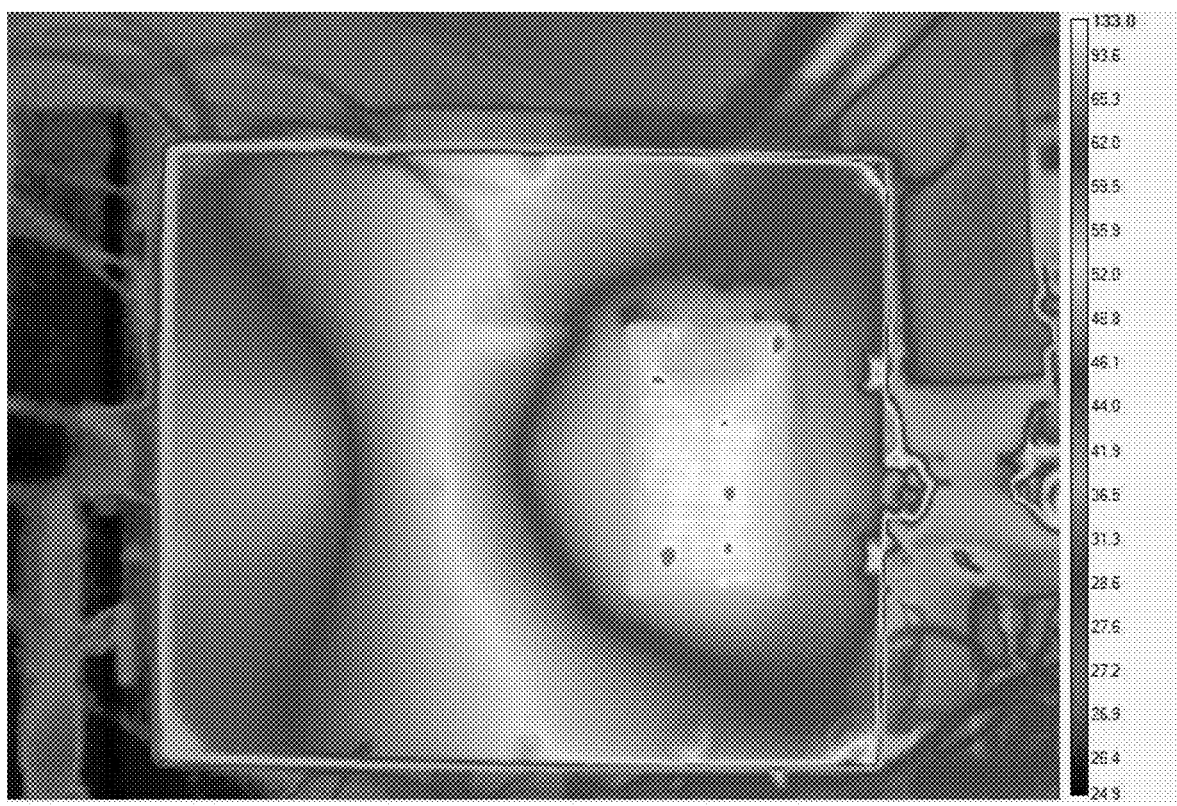
FIG. 27 provides an IR image of steady state evaporator according to embodiments.

Evaporator Performance:

The SFA evaporator was able to produce separated flow and verify the operation of the separated flow architecture. However, it was only possible to get the isothermal area to extend slightly beyond the heaters. FIG. 27 shows an IR image of the evaporator with 275 W applied near the outlet of the evaporator. The flow rate was 79 mL/min. In this case, the temperature difference across the entire heat acquisition surface was 40° C. The cold inlet fluid can be clearly seen at the inlet of the evaporator. The saturation temperature of the fluid was 72° C. This roughly corresponds to the whitish and red areas on the image (excluding the rectangular heater) which indicates the presence of vapor. While the vapor extends beyond the heaters somewhat, it clearly does not extend over the entire heat acquisition surface. The saturated vapor would need to extend over the entire heat acquisition surface, in order to meet the isothermality requirement.

This lack of isothermality stems from the fact that the liquid and vapor sides of the evaporator have a strong thermal coupling (as discussed above). The evaporator is made of solid aluminum, and relies on a bulky bolted flange to attach the body and the cover plate. This means that the casing contributes to the strong thermal coupling of the liquid and vapor sides. Additionally, internal features of the evaporator also contribute to this coupling. Accordingly, embodiments may comprise configuration to thermally decouple the liquid and vapor sides of the evaporator, such as, for example, by using alternate designs and alternate (low conductivity) casing materials.

SUMMARY

Based on preliminary findings, the SFA architecture is preferable to the MFA architecture on several grounds. Perhaps most importantly, SFA systems are more predictable and amenable to analysis than MFA systems, since they predominately contain separated phases and single-phase flow. Additionally, for a given level of performance (power level, isothermality) an SFA system requires less power than an MFA system since no pre-heater is required for nominal operation. Finally, if no pre-heater is used, it appears that producing an isothermal evaporator is more feasible with an SFA system.

An MFA system clearly has the potential to accommodate an evaporator that can meet the thermal requirements outlined above. However, the costs associated with such a system are likely higher. Firstly, to achieve a high degree of isothermality will require using a pre-heater to bring the working fluid up to saturation prior to the evaporator. While this required heater power can be offset by using a recuperating heat exchanger between the evaporator inlet and outlet, there will still be a mass and/or power cost. The amount of pre-heat required could be significant if the pump requires a high degree of subcooling. The second significant issue with an MFA system is the lingering threat of two-phase flow instabilities and the attendant unpredictability of two-phase flow in microgravity. This introduces significant uncertainty into the design. A low power system (like the one required here) that does not rely on using large pressure drops or high flow rates to suppress instabilities is especially susceptible to these types of instabilities.

An SFA system circumvents the two major objections brought against MFA systems. Firstly, it greatly reduces the risk of developing two-phase flow instabilities by ensuring that the liquid and vapor phases remain separated throughout the entire system (excepting in the condenser). This separation of phases also makes the system much more amenable to analytic modelling. Secondly, an SFA evaporator has the potential to meet the isothermality requirements described above without the need of a pre-heater. It was experimentally shown that an SFA evaporator was able to produce a small isothermal island at saturated conditions with fluid entering the evaporator 50° C. subcooled.

DOCTRINE OF EQUIVALENTS

While the above description contains many specific embodiments of the invention, these should not be construed as limitations on the scope of the invention, but rather as an example of one embodiment thereof. Accordingly, the scope of the invention should be determined not by the embodiments illustrated, but by the appended claims and their equivalents.

What is claimed is:

1. A multi-phase evaporator comprising:
an evaporator body having at least one outer heating surface and defining an internal volume;
a vapor channel network comprising a plurality of elongated heat transfer elements separated by a plurality of channels, wherein the elongated heat transfer elements have first ends integrally formed on an inner wall of the internal volume opposite at least one outer heating surface such that the elongated heat transfer elements and the outer heating surface are in thermal contact, and having second ends distal from inner wall;
a wick element comprising a liquid porous body integrally formed on the second ends of the elongated heat transfer elements;
wherein the outer heating surface, the vapor channel network, and the wick element are 3D printed as a unitary piece;
a fluid reservoir disposed within the internal volume such that the wick element is interposed between the fluid reservoir and the vapor channel network;
at least one fluid inlet disposed in a wall of the evaporator body such that fluid flows into the fluid reservoir; and
at least one outlet disposed in a wall of the evaporator body, the at least one outlet configured to transport both heated vapor and heated liquid from the evaporator body.

2. The multi-phase evaporator of claim 1:
wherein the at least one outlet is at least two outlets, wherein at least a first of the at least two outlets is configured to transport heated liquid from the fluid reservoir, and wherein at least a second of the at least two outlets is configured to transport heated vapor from the vapor channel network; and
wherein the wick element is disposed within the evaporator body and configured as a phase separator between the vapor channel network and the fluid reservoir.

3. The multi-phase evaporator of claim 2, wherein the wick element spans the entire opening between the fluid reservoir and the vapor channel network.

4. The multi-phase evaporator of claim 1, further comprising an evaporator cap configured to seal the internal volume adjacent the fluid reservoir.

5. The multi-phase evaporator of claim 4, wherein the evaporator cap further comprises a plurality of depressions formed into the inner surface thereof, the plurality of depressions being configured to engage a plurality of resilient members configured to engage and apply a preload force onto the wick element such that thermal contact is maintained between the wick element and the second surfaces of the plurality of elongated heat transfer elements.

6. The multi-phase evaporator of claim 1, wherein the wick element is formed of a porous material having variable porosity.

7. The multi-phase evaporator of claim 6, wherein the porosity of the wick element varies continuously through the cross-section of the wick element.

8. The multi-phase evaporator of claim 1, wherein the wick element serves as a structural member of the body of the evaporator.

9. The multi-phase evaporator of claim 1, wherein the at least one heating surface is configured to conform with the body of an external heat generating element.

10. The multi-phase evaporator of claim 1, wherein the plurality of elongated heat transfer elements are solid, porous, or a combination thereof.

11. The multi-phase evaporator of claim 1, wherein the ratio of the width of the elongated heat transfer element to a length determined by the width of an elongated heat transfer element and adjacent vapor channel is from 0.5 to 0.8.

12. The multi-phase evaporator of claim 1, wherein the width of the elongated heat transfer element is from 0.25 to 0.4 inches.

13. The multi-phase evaporator of claim 1, wherein the wall in which the at least one fluid inlet is disposed and the wall in which the at least one fluid outlet is disposed are formed from a material having lower thermal conductivity than aluminum or copper.

14. A thermal control system comprising:
a fluid handling system comprising a plurality of interconnected fluid conduits;
a pump in fluid communication with the fluid handling system;
an evaporator in fluid communication with the fluid handling system and configured to pick up a heat load comprising:
an evaporator body having at least one outer heating surface and defining an internal volume,
a vapor channel network comprising a plurality of elongated heat transfer elements separated by a plurality of channels, wherein the elongated heat transfer elements have first ends integrally formed with an inner wall of the internal volume opposite the at least one outer heating surface such that the elongated heat transfer elements and the outer heating surface are in thermal contact, and having second ends distal from inner wall;
a wick element comprising a liquid porous body integrally formed with the second ends of the elongated heat transfer elements,
wherein the outer heating surface, the vapor channel network, and the wick element are 3D printed as a unitary piece,
a fluid reservoir disposed within the internal volume such that the wick element is interposed between the fluid reservoir and the vapor channel network,
at least one fluid inlet disposed in a wall of the evaporator body such that fluid flows into the fluid reservoir, and at least one outlet disposed in a wall of the evaporator body, the at least one outlet configured to transport both heated vapor and heated liquid from the evaporator body;
a condenser in fluid communication with the fluid handling system downstream of the evaporator and configured to reject the heat load; and
an accumulator in fluid communication with the fluid handling system disposed at an inlet of the pump and configured to regulate the system pressure.

15. The thermal control system of claim 4:
wherein the at least one outlet is at least two outlets, wherein at least a first of the at least two outlets is configured to transport heated liquid from the fluid reservoir, and wherein at least a second of the at least two outlets is configured to transport heated vapor from the vapor channel network; and
wherein the wick element is disposed within the evaporator body and configured as a phase separator between the vapor channel network and the fluid reservoir.

16. The thermal control system of claim 4, wherein the wick element is formed of a porous material having variable porosity.

17. The multi-phase evaporator of claim 1, wherein the evaporator body further comprises an evaporator cap, wherein the wick element is integrally formed with the evaporator cap and the outer heating surface, the evaporator cap, the vapor channel network, and the wick element are 3D printed as a unitary piece.

18. The thermal control system of claim 4, wherein the evaporator body further comprises an evaporator cap, wherein the wick element is integrally formed with the evaporator cap and the outer heating surface, the evaporator cap, the vapor channel network, and the wick element are 3D printed as a unitary piece.

19. The thermal control system of claim 4, wherein one of the interconnected fluid conduits in the fluid handling system is a liquid outlet line that allows a liquid flow to bypass the evaporator and continually circulate through the system.

20. The multi-phase evaporator of claim 1, wherein the outer heating surface, the vapor channel network, and the wick element are 3D printed using electron beam sintering or laser sintering.

* * * * *